United States Patent
Shimomura et al.

(10) Patent No.: US 7,932,164 B2
(45) Date of Patent: Apr. 26, 2011

(54) METHOD FOR MANUFACTURING SEMICONDUCTOR SUBSTRATE BY USING MONITOR SUBSTRATE TO OBTAIN OPTIMAL ENERGY DENSITY FOR LASER IRRADIATION OF SINGLE CRYSTAL SEMICONDUCTOR LAYERS

(75) Inventors: Akihisa Shimomura, Atsugi (JP); Masaki Koyama, Atsugi (JP); Motoki Nakashima, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 16 days.

(21) Appl. No.: 12/402,518

(22) Filed: Mar. 12, 2009

(65) Prior Publication Data
US 2009/0230503 A1 Sep. 17, 2009

(30) Foreign Application Priority Data
Mar. 17, 2008 (JP) ................................. 2008-067302

(51) Int. Cl.
*H01L 21/30* (2006.01)
*H01L 21/301* (2006.01)
*H01L 21/46* (2006.01)

(52) U.S. Cl. ........................ 438/458; 438/455; 438/459

(58) Field of Classification Search .................. 438/455, 438/458, 459
See application file for complete search history.

(56) References Cited

U.S. PATENT DOCUMENTS
2007/0281172 A1 12/2007 Couillard et al.
2008/0280424 A1* 11/2008 Yamazaki et al. ............ 438/480
2009/0170286 A1* 7/2009 Tsukamoto et al. .......... 438/458
2009/0321747 A1* 12/2009 Murphy et al. ................ 257/77

FOREIGN PATENT DOCUMENTS
JP 11-097379 4/1999
JP 2000-294754 10/2000

* cited by examiner

*Primary Examiner* — N Drew Richards
*Assistant Examiner* — Michael Jung
(74) *Attorney, Agent, or Firm* — Eric J. Robinson; Robinson Intellectual Property Law Office, P.C.

(57) ABSTRACT

Methods for manufacturing a semiconductor substrate and a semiconductor device by which a high-performance semiconductor element can be formed are provided. A single crystal semiconductor substrate including an embrittlement layer and a base substrate are bonded to each other with an insulating layer interposed therebetween, and the single crystal semiconductor substrate is separated along the embrittlement layer by heat treatment to fix a single crystal semiconductor layer over the base substrate. Next, a plurality of regions of a monitor substrate are irradiated with laser light under conditions of different energy densities, and carbon concentration distribution and hydrogen concentration distribution in a depth direction of each region of the single crystal semiconductor layer which has been irradiated with the laser light is measured. Optimal irradiation intensity of laser light is irradiation intensity with which a local maximum of the carbon concentration and a shoulder peak of the hydrogen concentration are observed. A single crystal semiconductor layer is irradiated with optimal laser light at energy density detected by using the monitor substrate, whereby a semiconductor substrate is manufactured.

9 Claims, 12 Drawing Sheets
(1 of 12 Drawing Sheet(s) Filed in Color)

FIG. 5B
FIG. 5A
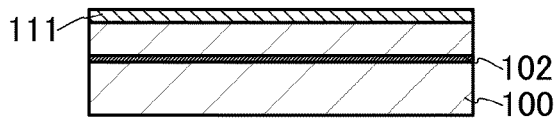
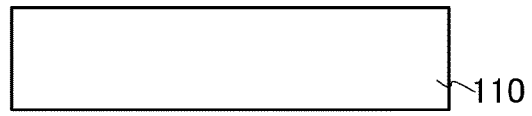
FIG. 5C
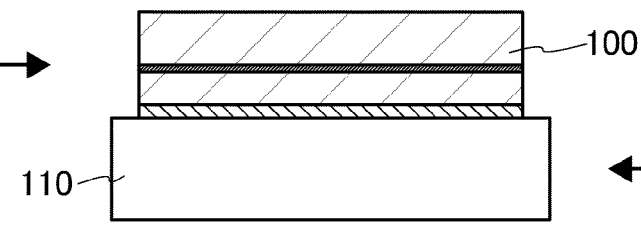
FIG. 5D
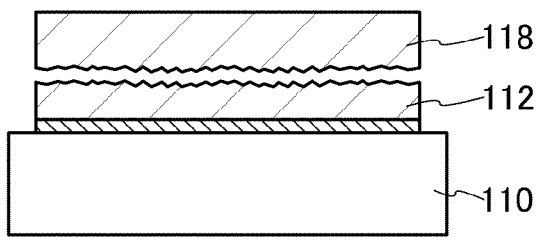
FIG. 5E
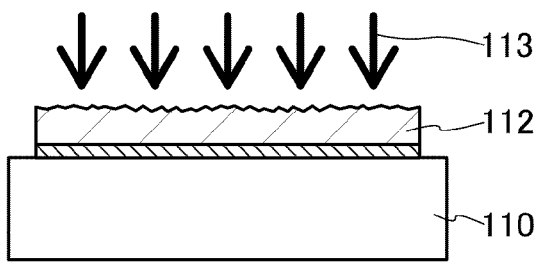
FIG. 5F
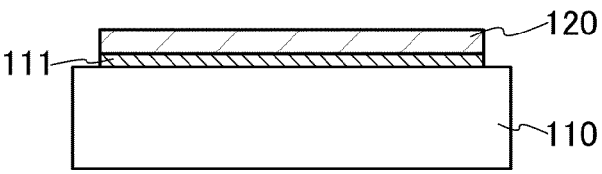

METHOD FOR MANUFACTURING SEMICONDUCTOR SUBSTRATE BY USING MONITOR SUBSTRATE TO OBTAIN OPTIMAL ENERGY DENSITY FOR LASER IRRADIATION OF SINGLE CRYSTAL SEMICONDUCTOR LAYERS

BACKGROUND OF THE INVENTION

1. Field of the Invention

The present invention relates to a method for manufacturing a semiconductor substrate. In addition, the present invention relates to a semiconductor device manufactured using the semiconductor substrate.

2. Description of the Related Art

In recent years, integrated circuits using an SOI (silicon on insulator) substrate in which a thin single crystal semiconductor layer is formed on an insulating surface, instead of a bulk silicon wafer, have been developed. By utilizing characteristics of a thin single crystal silicon layer formed over an insulating film, transistors formed in the integrated circuit can be electrically separated from each other completely. Further, each transistor can be formed as a fully-depleted transistor, and thus a semiconductor integrated circuit with high added value such as high integration, high speed driving, and low voltage consumption can be realized.

As a method for manufacturing an SOI substrate, a hydrogen ion implantation separation method in which hydrogen ion implantation and separation are combined is known. A summary of a method for manufacturing an SOI substrate by a hydrogen ion implantation separation method is described below. First, by implantation of hydrogen ions into a silicon wafer serving as a separation substrate by an ion implantation method, an ion-implanted layer is formed at a predetermined depth from the surface. Next, the silicon wafer into which hydrogen ions are implanted is bonded to another silicon wafer with a silicon oxide film interposed therebetween. Then, through heat treatment, the ion-implanted layer serves as a cleavage plane and separation into a thin film occurs in the silicon wafer to be separated into which hydrogen ions are implanted. Accordingly, a single crystal silicon film can be formed over the silicon wafer to be separated. The hydrogen ion implantation separation method may also be referred to as a Smart Cut (registered trademark) method.

A method for forming a single crystal silicon film over a base substrate made of glass by using a hydrogen ion implantation separation method as described above has been proposed (for example, see Patent Document 1: Japanese Published Patent Application No. H11-097379 and Patent Document 2: Japanese Published Patent Application No. 2000-294754). In Patent Document 1, a separation plane is mechanically polished to remove a defect layer which is formed by ion implantation or a step of several to several tens of nanometers in the separation plane. In Patent Document 2, planarity of the single crystal semiconductor layer is improved by performing heat treatment such as laser light irradiation on the single crystal semiconductor layer after a separation process.

SUMMARY OF THE INVENTION

In the case where a thin single crystal semiconductor layer is formed using a hydrogen ion implantation separation method, planarity of a surface of the single crystal semiconductor layer which is formed is lost because of ion implantation, a physical impact in separation, or the like, and crystal defects are increased. On the other hand, it is required to suppress unevenness of the surface of the separation plane in order to form high-performance semiconductor elements. This is because a gate electrode is formed over a semiconductor layer with a gate insulating layer interposed therebetween in the case where a transistor is manufactured using an SOI substrate, and if there is large unevenness of the semiconductor layer, it is difficult to manufacture a gate insulating layer with high dielectric strength. Large unevenness of the surface of the semiconductor layer causes a decrease in performance of the semiconductor element such as a decrease in field effect mobility, an increase in threshold voltage, or the like. Thus, mechanical polishing such as grinding or polishing is required to recover the planarity of the single crystal semiconductor layer after separation.

Since a glass substrate has a larger size and is less expensive than a silicon wafer, a glass substrate is used as a base substrate, whereby a large-sized inexpensive SOI substrate can be manufactured. However, since a glass substrate is more easily bent than a silicon wafer and has an undulated surface, it is difficult to perform mechanical polishing on a large-sized glass substrate having a side that is longer than 30 cm, in particular. Accordingly, from the viewpoint of processing accuracy, yield, or the like, treatment by mechanical polishing on a separation plane is not recommended to be used for planarization treatment of a semiconductor layer that is bonded to a base substrate.

In Patent Document 2, a method for improving planarity of a single crystal semiconductor layer by irradiating the single crystal semiconductor layer with laser light after separation is proposed. However, the present inventors found through their research that, in the case where irradiation intensity of laser light is too high, problems occur in that planarity of a surface is lowered and a part of a single crystal semiconductor layer is microcrystallized. Therefore, irradiation intensity of laser light used for irradiation is needed to be optimized in order to achieve planarization of the single crystal semiconductor layer; however, optimal irradiation intensity of laser light is changed depending on a thickness of the single crystal semiconductor layer, irradiation atmosphere, or the like, so it is not easy to uniformly determine optimal irradiation intensity of laser light.

In view of the above-described problems, it is an object of an embodiment of the present invention to manufacture a single crystal semiconductor layer having favorable planarity and a semiconductor substrate including the single crystal semiconductor layer by optimization of conditions for laser light with which the single crystal semiconductor layer fixed over a base substrate is irradiated.

In addition, it is an object of an embodiment of the present invention to provide methods for manufacturing a semiconductor substrate and a semiconductor device by which a high-performance semiconductor element can be formed.

In an embodiment of the present invention, a plurality of regions of a monitor substrate are irradiated with laser light under conditions of different energy densities, and carbon concentration distribution and hydrogen concentration distribution in a depth direction of each region of a single crystal semiconductor layer after irradiation with laser light are measured. Then, a single crystal semiconductor layer is irradiated with laser light at optimal energy density detected by using the monitor substrate, whereby a semiconductor substrate is manufactured. The details are as follows.

An embodiment of the present invention is a method for manufacturing a semiconductor substrate including the steps of: irradiating surfaces of a first to an n-th ($n \geq 2$) single crystal semiconductor substrate with ions to form embrittlement layers at a predetermined depth from the surfaces of the first to the n-th single crystal semiconductor substrate; bonding the first to the n-th single crystal semiconductor substrate to a first to an n-th base substrate, respectively, with insulating layers, which are provided on at least one of respective pairs of the single crystal semiconductor substrates and the base substrates, interposed between the single crystal semiconductor substrates and the base substrates; separating the first to the n-th single crystal semiconductor substrate along the embrittlement layers through heat treatment to fix a first to an n-th single crystal semiconductor layer over the first to the n-th base substrate; irradiating a plurality of regions of the first single crystal semiconductor layer with laser light under conditions of different energy densities; measuring carbon concentration distribution and hydrogen concentration distribution in a depth direction of each region of the first single crystal semiconductor layer which has been irradiated with laser light; and irradiating the second to the n-th single crystal semiconductor layer with laser light under a condition of energy density where a local maximum of a carbon concentration is observed and a shoulder peak of a hydrogen concentration is observed in concentration distribution in a depth direction of the first single crystal semiconductor layer.

Further, an embodiment of the present invention is a semiconductor substrate including: a base substrate; an insulating layer provided over the base substrate; and a single crystal semiconductor layer fixed over the base substrate with the insulating layer interposed therebetween, wherein a local maximum of a carbon concentration is observed and a shoulder peak of a hydrogen concentration is observed in concentration distribution in a depth direction of the single crystal semiconductor layer.

Note that, in this specification, a bonding layer can be formed not only on the surface of the single crystal semiconductor substrate but also on the surface of the base substrate. Alternatively, the bonding layer can be formed only on the surface of the base substrate.

Further, in this specification, a shoulder peak means a profile having a shoulder which is observed near an interface of an insulating layer, in a depth direction of the single crystal semiconductor layer.

By application of an embodiment of the present invention, an optimal condition for irradiation of a single crystal semiconductor layer with laser light can be detected by a simple method. In addition, by using this detection method, a single crystal semiconductor layer having favorable planarity can be efficiently manufactured.

Therefore, a high-performance semiconductor element can be efficiently formed by using a semiconductor substrate which is an embodiment of the present invention.

BRIEF DESCRIPTION OF THE DRAWINGS

The patent or application file contains at least one drawing executed in color. Copies of this patent or patent application publication with the color drawing will be provided by the Office upon request and payment of the necessary fee.

FIGS. 5A to 5F are diagrams illustrating a manufacturing process of a semiconductor substrate.

DETAILED DESCRIPTION OF THE INVENTION

Embodiment Mode 1

In this embodiment mode, a planarization treatment process of a single crystal semiconductor layer in a manufacturing method of a semiconductor substrate is described. Specifically, in a process in which a single crystal semiconductor layer separated from a single crystal semiconductor substrate is irradiated with laser light to be planarized, a method for detecting an optimal condition for laser light used for irradiation is described with reference to FIG. 1, FIGS. 2A and 2B, and FIG. 3.

Figure 1:
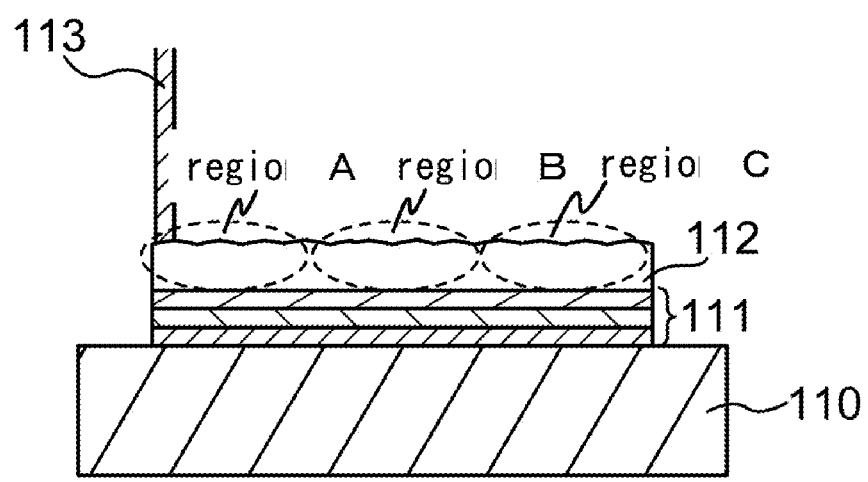
FIG. 1 is a diagram illustrating an example of a laser light irradiation process.

FIG. 1 illustrates a process in which a plurality of regions of a single crystal semiconductor layer 112 provided in a monitor substrate are irradiated with laser light 113. In FIG. 1, the single crystal semiconductor layer 112 separated from a single crystal semiconductor substrate is provided over a base substrate 110 with an insulating layer 111 interposed therebetween. In FIG. 1, three regions A to C of the single crystal semiconductor layer 112 are irradiated with the laser light 113 under conditions of different energy densities. Note that, as described above, planarity of a surface of the single crystal semiconductor layer 112 which has been separated from the single crystal semiconductor substrate is lost because of ion implantation, a physical impact in separation, or the like. As the single crystal semiconductor substrate, for example, a single crystal silicon substrate, a single crystal germanium substrate, or a single crystal compound semiconductor substrate of gallium arsenide, indium phosphide, or the like can be used. In this embodiment mode, as the single crystal semiconductor substrate, a silicon wafer is used.

When the single crystal semiconductor layer 112 is irradiated with the laser light 113, the single crystal semiconductor layer 112 absorbs the laser light 113, and the temperature of a portion irradiated with the laser light 113 is increased. When the temperature of this portion is higher than or equal to the melting point of the single crystal semiconductor layer 112, the single crystal semiconductor layer 112 is melted, and defects can be repaired. After irradiation with the laser light 113 is stopped, the temperature of a melted portion of the single crystal semiconductor layer 112 is decreased, and the melted portion is solidified and recrystallized (re-single-crystallized) before long. Accordingly, the planarity of the single crystal semiconductor layer is improved, and crystallinity can be recovered. Note that the laser light for melting the single crystal semiconductor layer 112 is emitted from an upper side of the single crystal semiconductor layer 112.

As the base substrate 110, for example, a glass substrate can be used. In this embodiment mode, a glass substrate with a thickness of 0.7 mm is used. As the insulating layer 111, a single layer of a silicon oxide film, a silicon oxynitride film, a silicon nitride film, a silicon nitride oxide film, or the like, or a stacked layer thereof can be used. These films can be formed using a thermal oxidation method, a CVD method, a sputtering method, or the like. In the case where the insulating layer 111 is formed using a CVD method, as the insulating layer 111, a silicon oxide film formed by a chemical vapor deposition method using an organosilane gas such as tetraethoxysilane (abbreviation: TEOS) (chemical formula: $Si(OC_2H_5)_4$) can be used. In addition, an insulating film containing silicon as a main component such as a silicon carbide (SiC) film may be used. Note that the insulating layer 111 preferably includes a barrier layer that can prevent sodium from being diffused from the base substrate 110 side. As the barrier layer, a silicon nitride oxide film or a silicon nitride film can be used. In this embodiment mode, the insulating layer 111 has a structure in which a silicon oxide film, a silicon nitride oxide film, and a silicon oxynitride film are stacked in this order from the base substrate 110 side such that each film has a thickness of 50 nm.

Note that a silicon oxynitride film refers to a film which contains more oxygen than nitrogen and, in the case where measurements are performed using Rutherford backscattering spectrometry (RBS) and hydrogen forward scattering (HFS), contains oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film refers to a film which contains more nitrogen than oxygen, and in the case where measurements are performed using RBS and HFS, contains oxygen, nitrogen, silicon, and hydrogen at concentrations ranging from 5 to 30 at. %, 20 to 50 at. %, 25 to 35 at. %, and 15 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

A laser which emits the laser light 113 may be any of a continuous wave laser, a quasi continuous wave laser, and a pulsed laser; however, a pulsed laser is preferably used. This is because pulsed laser light having high energy can be emitted instantaneously and a melted state can be formed easily. The repetition rate is preferably about greater than or equal to 1 Hz and less than or equal to 10 MHz.

As the laser, for example, as a gas laser, an excimer laser such as a KrF laser, an Ar laser, a Kr laser, or the like can be used. Alternatively, as a solid-state laser, a YAG laser, a $YvO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, or the like may be used. Note that an excimer laser is a pulsed laser, and some solid-state lasers such as a YAG laser can be used as a continuous laser, a pseudo continuous laser, and a pulsed laser.

Figure 2A:
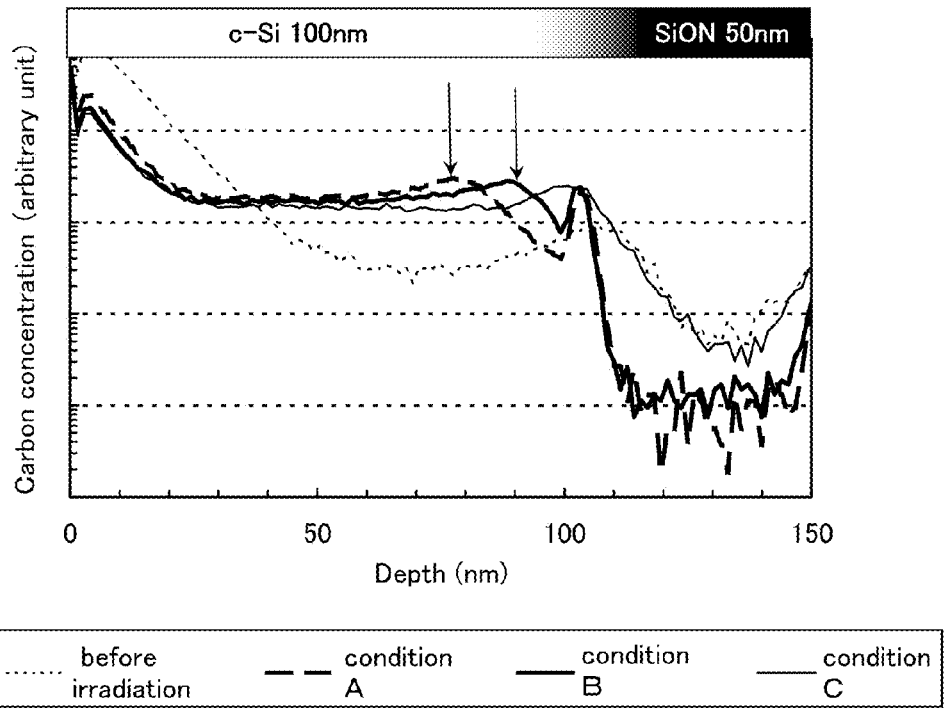
FIGS. 2A and 2B are graphs each showing element concentration distribution in a depth direction of a single crystal semiconductor layer.
Figure 2B:
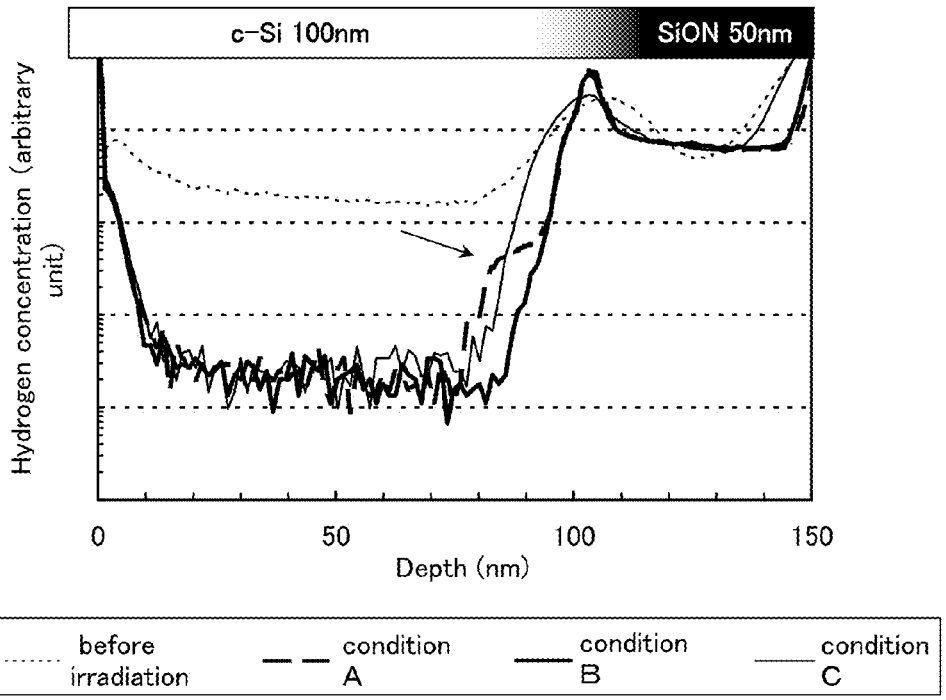

In this embodiment mode, a XeCl excimer laser is used as a laser, and a wavelength of the laser light 113 is set to be 308 nm. Further, the regions A to C of the single crystal semiconductor layer 112 are irradiated with the laser light 113 at different energy densities. Specifically, the region A is irradiated with the laser light 113 under a condition A of energy density; the region B is irradiated with the laser light 113 under a condition B of energy density; and the region C is irradiated with the laser light 113 under a condition C of energy density. The conditions A to C are as follows.
Condition A: 568 $mJ/cm^2$
Condition B: 584 $mJ/cm^2$
Condition C: 600 $mJ/cm^2$ Element concentration distribution of each region of the single crystal semiconductor layer 112 which has been irradiated with the laser light is distinctive depending on the energy density of the laser light 113 used for irradiation. FIGS. 2A and 2B show an example of the concentration distribution in a depth direction of each region of the single crystal semiconductor layer 112 which has been irradiated with the laser light 113 under the conditions A to C. In FIG. 2A, a horizontal axis represents depth (nm) from the surface of the single crystal semiconductor layer 112, and a vertical axis represents carbon concentration (arbitrary unit). Further, in FIG. 2B, a horizontal axis represents depth (nm) from the surface of the single crystal semiconductor layer 112, and a vertical axis represents hydrogen concentration (arbitrary unit). In FIGS. 2A and 2B, dotted lines in the graphs represent carbon concentration distribution and hydrogen concentration distribution before irradiation with the laser light 113. Note that, as a method for analyzing the concentration distribution in a depth direction, secondary ion mass spectrometry (SIMS) can be preferably used.

As shown in FIG. 2A, in the single crystal semiconductor layer which has been irradiated with the laser light, carbon concentration is increased as compared to a single crystal semiconductor substrate which has not been irradiated with the laser light because of introduction of carbon in the air into the film in irradiation or the like. In the case where the irradiation with the laser light is performed under the conditions A and B, in the carbon concentration distribution of the single crystal semiconductor layer 112, a local maximum is observed. That is, in the single crystal semiconductor layer which has been irradiated under the conditions A and B, a change in concentration within the film is observed, and the carbon concentration on the surface side is higher than the carbon concentration on the side closer to the interface with the insulating layer. The local maximum is in a region which is within about 20 nm from the interface with the insulating layer under the condition A while it is in a region which is within about 10 nm from the interface with the insulating layer under the condition B. That is, the local maximum of the carbon concentration appears in the region which is nearer the interface with the insulating layer 111 under the condition B where the energy density is higher than that under the condition A. On the other hand, in the case where the irradiation with the laser light is performed under the condition C, in the carbon concentration distribution of the single crystal semiconductor layer 112, a local maximum is not observed.

Further, as shown in FIG. 2B, in the single crystal semiconductor layer 112 which has been irradiated with the laser light, hydrogen included in the single crystal semiconductor layer is released into the air or into the insulating layer in irradiation, so the hydrogen concentration on the side closer to the surface of the single crystal semiconductor layer 112 is reduced as compared to the case where laser light irradiation is not performed. In the case where the laser light irradiation is performed under the condition A, a shoulder peak of the hydrogen concentration of the single crystal semiconductor layer 112 is observed. That is, in the single crystal semiconductor layer which is irradiated under the condition A, it is observed that hydrogen concentration within the film is gradually changed. The shoulder peak roughly corresponds to the local maximum of the carbon concentration. On the other hand, in the case where the laser light irradiation is performed under the conditions B and C, the shoulder peak is not observed.

The summary of the above-described content is as follows. In the case where the laser light irradiation is performed under the condition A, the local maximum of the carbon concentration is observed in the element concentration distribution of the region A of the single crystal semiconductor layer. In addition, the shoulder peak of the hydrogen concentration is observed in the same position as the local maximum of the carbon concentration. In the case where the laser light irradiation is performed under the condition B, the local maximum of the carbon concentration is observed in the element concentration distribution of the region B of the single crystal semiconductor layer. The shoulder peak of the hydrogen concentration is not observed in the same position as the local maximum of the carbon concentration. In the case where the laser light irradiation is performed under the condition C, the local maximum of the carbon concentration and the shoulder peak of the hydrogen concentration are both not observed in the element concentration distribution of the region C of the single crystal semiconductor layer.

The present inventors found that differences in concentration of carbon atoms and hydrogen atoms in the single crystal semiconductor layer after recrystallization, which is generated by a difference in energy density of laser light, depend on how much the single crystal semiconductor layer is melted in laser light irradiation. That is, behaviors of hydrogen atoms or carbon atoms in the single crystal semiconductor layer (in this embodiment mode, a silicon layer) are changed depending on whether the single crystal semiconductor layer is in a melted state or a crystalline state when irradiated with the laser light. Therefore, it can be thought that differences in concentration occur in the vicinity of a solid-liquid interface.

Figure 3:
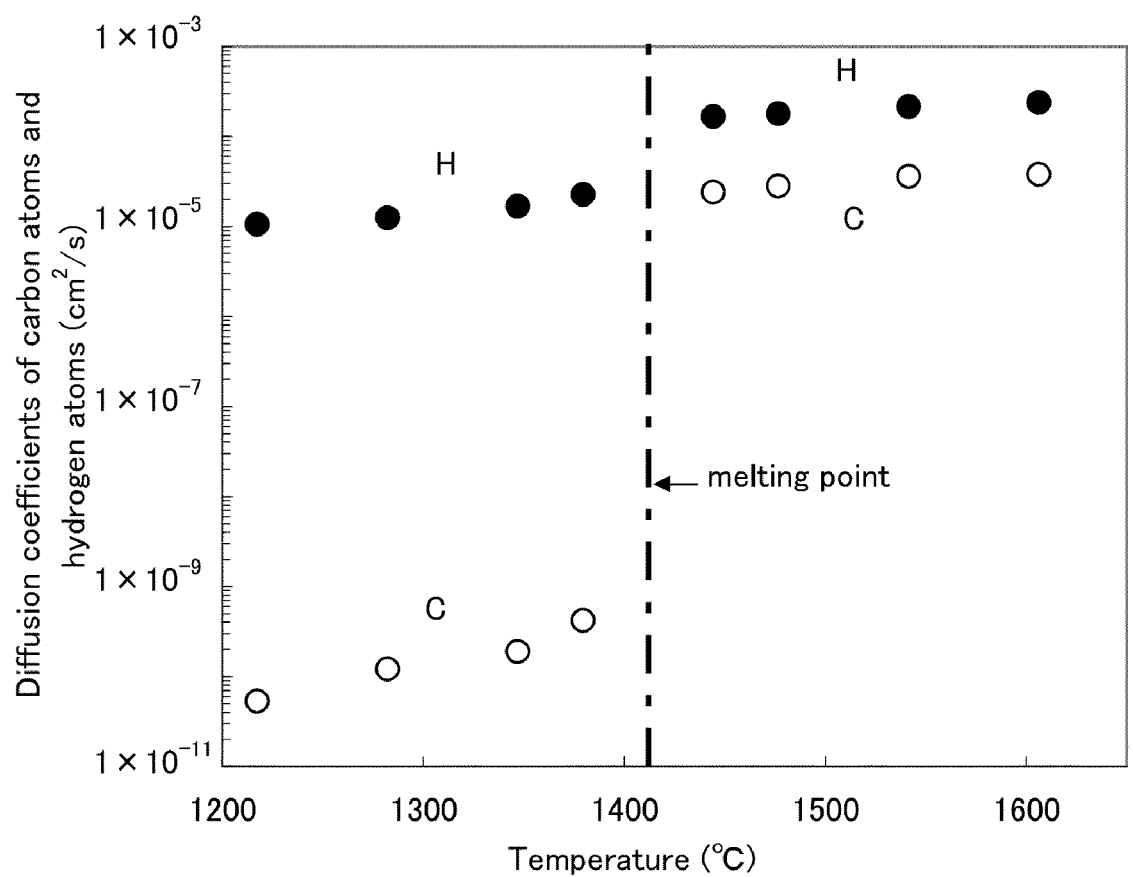
FIG. 3 is a graph showing diffusion coefficients of hydrogen atom and carbon atom in a melted state and a crystalline state.

In FIG. 3, diffusion coefficients of carbon atoms and hydrogen atoms in silicon in a crystalline state and a melted state which are calculated using a classical molecular dynamics method are shown. In FIG. 3, a horizontal axis represents a temperature (° C.), and a vertical axis represents diffusion coefficients ($cm^2/s$) of carbon atoms and hydrogen atoms. Further, black circles represent diffusion coefficients of hydrogen atoms, and white circles represent diffusion coefficients of carbon atoms. Since the melting point of silicon is 1410° C., in FIG. 3, diffusion coefficients of atoms in a crystalline state are shown in a region lower than 1410° C., and diffusion coefficients of atoms in a melted state are shown in a region higher than or equal to 1410° C.

As shown in FIG. 3, diffusion coefficients of carbon atoms in a crystal silicon are extremely low, i.e., $1\times10^{-9}$ $cm^2/s$, and the carbon atoms are hardly diffused in the crystal silicon. On the other hand, diffusion coefficients of carbon atoms in a state where silicon is melted are greater than or equal to $10^4$ times larger than diffusion coefficients of carbon atoms in the crystal silicon. In the case where the single crystal semiconductor layer which has been irradiated with laser light is melted into a liquid state (hereinafter, a completely melted state) from the surface to the interface with a base insulating layer, diffusion coefficients are roughly uniform in an entire region in the film thickness direction of the single crystal semiconductor layer, so carbon concentration is also uniform. On the other hand, in the single crystal semiconductor layer which has been irradiated with the laser light, in the case where an upper layer of the single crystal semiconductor layer is melted into a liquid phase and a lower layer thereof is not melted and remains as a single crystal semiconductor in a solid phase (hereinafter, a partially melted state), the diffusion coefficient of the upper layer is $10^4$ times larger than that of the lower layer, and a difference in carbon concentration is generated in a region in the vicinity of the solid-liquid interface due to the difference in diffusion coefficients.

As shown in FIG. 3, since the diffusion coefficients of hydrogen atoms in the crystal silicon are $1\times10^{-5}$ $cm^2/s$ at most, among the hydrogen atoms in the crystal silicon, some hydrogen atoms in the vicinity of the surface are only released into the air, and a change in concentration of hydrogen atoms within the entire film is small. On the other hand, the diffusion coefficients of hydrogen atoms in a state where silicon is melted are 10 or more times as high as those in a crystalline state, and the hydrogen atoms are easily released in the air. In the case where the single crystal semiconductor layer which has been irradiated with laser light is in a completely melted state, hydrogen atoms in the vicinity of the surface are easily released in the air although hydrogen atoms in the vicinity of the base insulating layer are not directly released in the air, and hydrogen atoms move such that a gradient between a layer in the vicinity of the surface and a layer in the vicinity of the insulating layer is decreased and a concentration of hydrogen atoms is uniform. Therefore, a concentration of hydrogen atoms of the entire single crystal semiconductor layer is greatly decreased as compared to before laser light irradiation. On the other hand, in the case where a single crystal semiconductor layer which has been irradiated with laser light is in a partially melted state, since the diffusion coefficients of hydrogen atoms in the vicinity of the surface are large, the hydrogen atoms are released in the air and the concentration is decreased; however, since the diffusion coefficients of hydrogen atoms in a solid-phase portion are small, a change in concentration is small as compared to the case of liquid phase. Therefore, concentration of hydrogen atoms of the entire single crystal semiconductor layer is not uniform, and a difference in concentration appears.

Accordingly, with use of the concentration distribution of hydrogen atoms and carbon atoms of the single crystal semiconductor layer after recrystallization, how much the single crystal semiconductor layer which has been irradiated with laser light is melted can be judged. In the results of SIMS measurement shown in FIGS. 2A and 2B, differences in concentrations (local maximums) of carbon atoms are observed under the conditions A and B, and the local maximum is not observed under the condition C; thus, it can be seen that the single crystal semiconductor layer is in a partially melted state under the conditions A and B and in a completely melted state under the condition C. Further, since carbon atoms are hardly diffused in a crystalline state, a vicinity of a region where a difference in carbon concentration appears, i.e., a vicinity of a local maximum can be approximate to the solid-liquid interface.

Further, a diffusion coefficient of a hydrogen atom is larger than that of a carbon atom, and in a partially melted state, concentrations of hydrogen atoms are decreased in a region where the single crystal semiconductor layer is melted and in a region which is heated by thermal conduction from the region to the temperature or higher at which a hydrogen gas is released. Therefore, a change of hydrogen concentration is more moderate than a change of carbon concentration and has a shoulder peak, and that position is shifted to be lower than the solid-liquid interface (in a direction of interface with the insulating layer). Note that, when the solid-liquid interface comes close to the interface with the insulating layer as in the case under the condition B, the entire single crystal semiconductor layer is heated to the temperature or higher at which a hydrogen gas is released, and hydrogen atoms are roughly uniformly diffused in the entire single crystal semiconductor layer; thus, a difference in concentration does not appear. In the case where the local maximum of the carbon concentration is observed and the shoulder peak of the hydrogen concentration corresponding to the local maximum of the carbon concentration is not observed in the element concentration distribution of the single crystal semiconductor layer, the single crystal semiconductor layer which has been irradiated with the laser light can be regarded as being in a partially melted state in which it is melted to the vicinity of the interface with the base insulating film.

Hereinafter, in this specification, a partially melted state in which a single crystal semiconductor layer after recrystallization has a shoulder peak of a hydrogen concentration corresponding to a local maximum of a carbon concentration is referred to as a narrowly-defined partially melted state, and a partially melted state in which a single crystal semiconductor layer after recrystallization has a local maximum of a carbon concentration and does not have a shoulder peak of a hydrogen concentration corresponding to the local maximum is represented as a quasi-completely melted state. A single crystal semiconductor layer which is in a quasi-completely melted state is melted to the vicinity of an interface with a lower insulating layer. For example, in this embodiment mode, a melted state, in which a single crystal semiconductor layer which is irradiated with laser light under the condition A, is a narrowly-defined partially melted state, and a melted state, in which a single crystal semiconductor layer which is irradiated with laser light under the condition B, is a quasi-completely melted state.

Figure 4A:
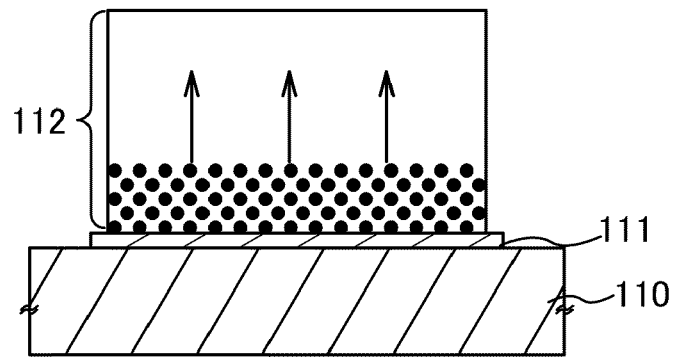
FIGS. 4A to 4C are model diagrams each illustrating an example of recrystallization of a single crystal semiconductor layer.

When the single crystal semiconductor layer 112 is in a narrowly-defined partially melted state by being irradiated with the laser light 113, planarization is advanced due to surface tension of a semiconductor that is changed into a liquid phase (FIG. 4A). At the same time, cooling of the single crystal semiconductor layer 112 is advanced due to thermal diffusion to the base substrate 110. In the single crystal semiconductor layer 112, temperature gradient is generated in the depth direction. The solid-liquid interface is moved from the base substrate 110 side to the surface of the single crystal semiconductor layer 112, and recrystallization occurs. A so-called longitudinal growth occurs. This recrystallization is advanced using as a seed a lower region which is not melted. Note that, in FIGS. 4A to 4C, black circles illustrated in the single crystal semiconductor layer 112 schematically represent seed crystals, and arrows schematically represent directions of crystal growth.

The lower solid-phase portion is single crystal and has uniform crystal orientation; thus, no crystal grain boundary is formed therein and the single crystal semiconductor layer 112 after a laser irradiation process can be a single crystal semiconductor layer without any crystal grain boundary. The upper melted portion is recrystallized by being solidified, and a single crystal semiconductor which has the same crystal orientation as the single crystal semiconductor in the lower portion which remains in a solid phase is formed. Therefore, in the case where a single crystal silicon wafer whose main surface is oriented along e.g., the (100) plane is used as the single crystal semiconductor substrate 100, a main surface of the single crystal semiconductor layer 112 is oriented along the (100) plane, and a main surface of the single crystal semiconductor layer 112 which is in a narrowly-defined partially melted state by laser irradiation process and is recrystallized is oriented along the (100) plane.

By irradiation with the laser light 113, the single crystal semiconductor layer 112 is in a narrowly-defined partially melted state. Thus, a single crystal semiconductor layer having a planarized surface can be formed. A melted portion of the single crystal semiconductor layer 112 is liquid and thus changes its shape by the action of surface tension so as to minimize its surface area. That is, a liquid portion is transformed so as to have no depressed and projecting portions, and this liquid portion is then solidified to perform recrystallization. Accordingly, the single crystal semiconductor layer having a planarized surface can be formed.

Figure 4B:
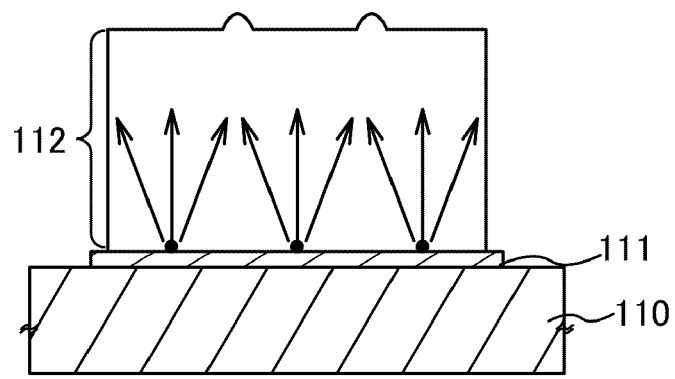

In the case where the single crystal semiconductor layer 112 is in a quasi-completely melted state, a small amount of solid which is not melted remains, and crystal growth is advanced using this as a seed crystal (FIG. 4B). Therefore, defects can be reduced due to solidification from the vicinity of the interface with the bottom insulating layer without crystallinity being reduced. Even in the case where crystal defects exist in the vicinity of the interface between the single crystal semiconductor layer and the bottom insulating layer, it is possible to repair the defects and recover crystallinity of the single crystal semiconductor layer. However, as illustrated in FIG. 4B, in the case where the single crystal semiconductor layer 112 is in a quasi-completely melted state, in a region between a seed crystal and another seed crystal, so-called lateral growth in which crystal growth occurs from the adjacent portion of single crystal semiconductor occurs, and unevenness is formed on the surface of the single crystal semiconductor layer.

Figure 4C:
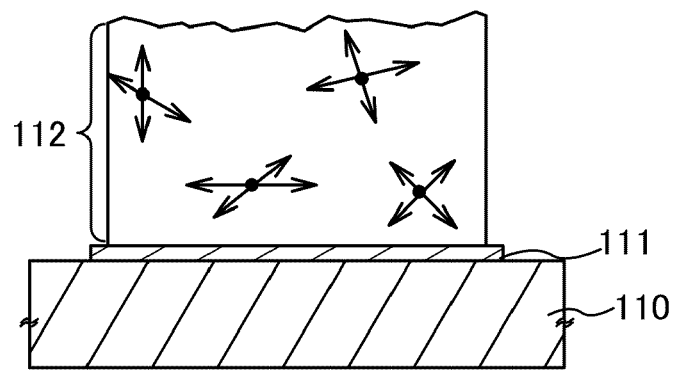

In the case where the single crystal semiconductor layer 112 is in a completely melted state, a part of the single crystal semiconductor layer is microcrystallized and crystallinity is decreased because of disordered nucleation of the single crystal semiconductor layer in a liquid phase (FIG. 4C).

In improving planarity of the single crystal semiconductor layer in the semiconductor substrate, in the case where the single crystal semiconductor layer which is irradiated with the laser light is in a narrowly-defined partially melted state, planarity and crystallinity are favorable. That is, in the case where planarization treatment is performed by laser light irradiation, in element concentration distribution in a depth direction of the single crystal semiconductor layer after recrystallization, it can be judged that a condition for irradiation where a local maximum of a carbon concentration and a shoulder peak of a hydrogen concentration are observed is an optimal condition.

As described above, element concentration distribution in a depth direction of a single crystal semiconductor layer after recrystallization is measured, and how much the single crystal semiconductor layer is melted is judged; thus, an optimal condition for laser light irradiation can be detected by an extremely simple method.

In the case where n (n≧2) semiconductor substrates 110 are manufactured by performing laser treatment on n (n≧2) single crystal semiconductor layers, after a plurality of regions of the single crystal semiconductor layer are irradiated with laser light under conditions of different energy densities using one semiconductor substrate of n semiconductor substrates as a monitor substrate, an optimal condition for irradiation is determined by measuring element concentration distribution in a depth direction of each region of the single crystal semiconductor layer after recrystallization. Then, (n−1) single crystal semiconductor layers are irradiated with laser light under the optimal condition. Accordingly, (n−1) semiconductor substrates each including a single crystal semiconductor layer with favorable planarity can be efficiently manufactured.

Further, by selecting optimal irradiation intensity of laser light, a defective substrate in which a single crystal semiconductor layer is microcrystallized in a manufacturing process of a semiconductor substrate can be prevented from being generated. Therefore, a semiconductor substrate including a favorable single crystal semiconductor layer can be manufactured at low cost.

Note that this embodiment mode can be freely combined with any of the other embodiment modes.

Embodiment Mode 2

In this embodiment mode, a method for manufacturing a semiconductor substrate using the method for detecting an optimal condition for laser light shown in Embodiment Mode 1 is described with reference to FIGS. 5A to 5F.

First, n (n≧2) base substrates 110 are prepared (see FIG. 5A). As the base substrate 110, a light-transmitting glass substrate used for a liquid crystal display device or the like can be preferably used. As a glass substrate, a substrate having a strain point of higher than or equal to 580° C. and lower than or equal to 680° C. (preferably, higher than or equal to 600° C. and lower than or equal to 680° C.) may be used. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that, as the base substrate 110, as well as the glass substrate, a substrate which is formed with an insulator, such as a ceramic substrate, a quartz substrate, or a sapphire substrate; a substrate which is formed with a semiconductor such as silicon; a substrate which is formed with a conductor such as metal or stainless steel; or the like can be used.

Although not shown in this embodiment mode, an insulating layer may be formed on a surface of the base substrate 110. By providing the insulating layer, in the case where an impurity (alkali metal, alkaline earth metal, or the like) is included in the base substrate 110, diffusion of the impurity into the semiconductor layer can be prevented. The insulating layer may have either a single-layer structure or a stacked-layer structure. As a material for forming the insulating layer, silicon oxide, silicon nitride, silicon oxynitride, silicon nitride oxide, or the like can be given.

Next, n (n≧2) single crystal semiconductor substrates 100 are prepared. As the single crystal semiconductor substrate 100, for example, a single crystal semiconductor substrate formed with an element belonging to Group 14 of the periodic table, such as silicon, germanium, silicon germanium, or silicon carbide can be used. Needless to say, a substrate formed with a compound semiconductor such as gallium arsenide or indium phosphide may be used. In this embodiment mode, as the single crystal semiconductor substrate 100, a single crystal silicon substrate is used. Although there is no limitation on the shape and the size of the single crystal semiconductor substrate 100, for example, it is possible to process a circular semiconductor substrate of 8 inches (200 mm) in diameter, 12 inches (300 mm) in diameter, 18 inches (450 mm) in diameter or the like, into a rectangular shape and to use the processed substrate. Note that, in this specification, the term "single crystal" means a crystal in which a regular crystal structure and crystal axes which are oriented in the same direction in all portions of the crystal. That is, it is not a matter of how many defects there are.

After the single crystal semiconductor substrate 100 is cleaned, an insulating layer is formed on a surface of the single crystal semiconductor substrate 100. Although it is possible that a structure where an insulating layer is not provided is employed, it is preferable to provide an insulating layer so that the single crystal semiconductor substrate 100 is prevented from being contaminated and the surface of the single crystal semiconductor substrate 100 is prevented from being damaged in later ion introduction.

Next, the single crystal semiconductor substrate 100 is irradiated with an ion beam formed of ions accelerated by an electric field, through the insulating layer, and an embrittlement layer 102 is formed in a region at a predetermined depth from the surface of the single crystal semiconductor substrate 100. The depth of the region where the embrittlement layer 102 is formed can be controlled by the accelerating energy of the ion beam and the incidence angle thereof. Here, the embrittlement layer 102 is formed in a region at a depth the same or substantially the same as the average depth at which the ions have entered.

The thickness of the semiconductor layer which is separated from the single crystal semiconductor substrate 100 is determined depending on the depth at which the embrittlement layer 102 is formed. The depth at which the embrittlement layer 102 is formed is greater than or equal to 50 nm and less than or equal to 500 nm, preferably greater than or equal to 50 nm and less than or equal to 200 nm, from the surface of the single crystal semiconductor substrate 100.

In introducing ions to the single crystal semiconductor substrate 100, an ion implantation apparatus or an ion doping apparatus can be used. In an ion implantation apparatus, a source gas is excited to produce ion species, the produced ion species are mass-separated, and ion species each having a predetermined mass is implanted in a process object. In an ion doping apparatus, a process gas is excited to produce ion species and ion species which are not mass-separated are introduced to the process object. In an ion doping apparatus provided with a mass separator, ion implantation with mass separation can be performed similarly to the ion implantation apparatus. In this specification, the use of one of an ion implantation apparatus and an ion doping apparatus is specified only in the case where one of them needs to be used, whereas in the case where there is not specific description, either of them may be used to perform ion introduction.

For example, an ion introduction process in the case of using an ion doping apparatus can be performed under the following conditions.

Accelerating voltage: greater than or equal to 10 kV and less than or equal to 100 kV (preferably, greater than or equal to 30 kV and less than or equal to 80 kV).

Dose: greater than or equal to $1\times10^{16}$ ions/cm$^2$ and less than or equal to $4\times10^{16}$ ions/cm$^2$.

Beam current density: greater than or equal to 2 μA/cm$^2$ (preferably, greater than or equal to 5 μA/cm$^2$, and more preferably, greater than or equal to 10 μA/cm$^2$).

In the case of using an ion doping apparatus, a gas containing hydrogen can be used as a source gas for an ion introduction process. With the gas containing hydrogen, H$^+$, H$_2^+$, and H$_3^+$ can be produced as ion species. In the case where the gas containing hydrogen is used as a source gas, it is preferable that introduction of a large proportion of H$_3^+$ be performed. Specifically, the proportion of H$_3^+$ ions which are included in the ion beam is preferably greater than or equal to 70% with respect to the total amount of H$^+$, H$_2^+$, and H$_3^+$; more preferably, the proportion of H$_3^+$ ions is greater than or equal to 80%. By increasing the proportion of H$_3^+$, the embrittlement layer 102 can contain hydrogen at a concentration of greater than or equal to $1\times10^{20}$ atoms/cm$^3$. Thus, separation from the embrittlement layer 102 becomes easier. When introduction of a large amount of H$_3^+$ is performed, introduction efficiency with ions is increased in comparison with the case of introduction of H$^+$ and H$_2^+$. That is, time required for ion introduction can be shortened.

When the ion implantation apparatus is used, it is preferable to implant H$_3^+$ ions through mass separation. Of course, H$_2^+$ ions may be implanted. Note that, in the case of using an ion implantation apparatus, introduction efficiency with ions may be reduced compared to the case of using an ion doping apparatus. This is because ion species are selectively implanted.

After the embrittlement layer 102 is formed, the insulating layer is removed, and the insulating layer 111 is newly formed (see FIG. 5B). Here, the reason why the insulating layer is removed is because the insulating layer is likely to be damaged in the ion introduction. Note that, in the case where damage of the insulating layer does not cause any problems, the insulating layer is not necessarily removed.

Since the insulating layer 111 forms bonding between a base substrate and a single crystal semiconductor substrate, it is preferable that a surface of the insulating layer 111 has high planarity. As the insulating layer 111 as described above, for example, a silicon oxide film formed by a chemical vapor deposition method using an organosilane gas can be used. Note that the insulating layer 111 has a single-layer structure in this embodiment mode; however, it may have a stacked-layer structure of two or more layers.

Further, the insulating layer 111 may be formed by performing heat treatment on the single crystal semiconductor substrate 100 under an oxidizing atmosphere. As a thermal oxidation treatment, oxidation in an oxidizing atmosphere in which halogen is added is preferably performed. Halogen is included in the insulating layer formed by performing heat oxidation in which halogen is added, and when halogen is included at a concentration of greater than or equal to $1 \times 10^{16}$ atoms/cm$^3$ and less than or equal to $2 \times 10^{21}$ atoms/cm$^3$, the insulating layer can function as a protective film which captures an impurity such as metal and prevents the single crystal semiconductor substrate 100 from being contaminated.

Then, n base substrates 110 and n single crystal semiconductor substrates 100 are bonded to each other (see FIG. 5C). Specifically, after the surfaces of the base substrate 110 and the insulating layer 111 are cleaned by a method such as ultrasonic cleaning, the surface of the base substrate 110 and the surface of the insulating layer 111 are disposed to be in contact with each other, and pressure treatment is performed so as to form bonding between the surface of the base substrate 110 and the surface of the insulating layer 111. It is considered that Van der Waals force, hydrogen bonding, or the like acts on a formation of the bonding. Note that two or more single crystal semiconductor substrates may be bonded to one base substrate.

Before the bonding is formed, oxygen plasma treatment or ozone treatment may be performed on the surface of the base substrate 110 or the surface of the insulating layer 111 so that the surface may become hydrophilic. With this treatment, a hydroxyl group is added to the surface of the base substrate 110 or the surface of the insulating layer 111. Therefore, hydrogen bonding can be efficiently formed.

Next, heat treatment is performed on the base substrate 110 and the single crystal semiconductor substrate 100 which are bonded to each other, so that bonding force is increased. At this time, it is necessary that the heating temperature be a temperature at which separation at the embrittlement layer 102 is not advanced. For example, the heating temperature can be lower than 400° C., preferably, lower than or equal to 300° C. There is no particular limitation on heat treatment time, and an optimal condition may be set as appropriate in accordance with a relationship between processing speed and bonding force. In this embodiment mode, heat treatment is performed at 200° C. for two hours. Here, only a region for bonding may be irradiated with a microwave so that the region can be locally heated. Note that, in the case where there is no problem with bonding force, the above-described heat treatment may be omitted.

Next, the single crystal semiconductor substrate 100 is separated into the single crystal semiconductor layer 112 and a single crystal semiconductor substrate 118 along the embrittlement layer 102 (see FIG. 5D). The single crystal semiconductor substrate 100 is separated by heat treatment. The heating temperature can be set based on the upper temperature limit of the base substrate 110. For example, when a glass substrate is used as the base substrate 110, the heating temperature is preferably higher than or equal to 400° C. and lower than or equal to 650° C. However, heat treatment may be performed at a temperature of higher than or equal to 400° C. and lower than or equal to 700° C. in a short time. Note that, in this embodiment mode, heat treatment is performed at 600° C. for two hours.

By performing the heat treatment as described above, volume change of microvoids formed in the embrittlement layer 102 occurs, whereby a crack in the embrittlement layer 102 is generated. As a result, the single crystal semiconductor substrate 100 is cleaved along the embrittlement layer 102. Since the insulating layer 111 is bonded to the base substrate 110, the single crystal semiconductor layer 112 separated from the single crystal semiconductor substrate 100 is fixed over the base substrate 110. Further, since an interface for bonding the insulating layer 111 to the base substrate 110 is heated by this heat treatment, covalent bonding is formed at the interface for bonding so that the bonding force between the base substrate 110 and the insulating layer 111 is further improved.

Then, the single crystal semiconductor layer 112 is irradiated with the laser light 113 for planarization of the single crystal semiconductor layer 112 (see FIG. 5E) or the like. Here, by using the method for detecting an optimal condition for laser light shown in Embodiment Mode 1, the single crystal semiconductor layer 112 can be efficiently planarized. That is, a first base substrate provided with a first single crystal semiconductor layer is used as a monitor substrate, and this monitor substrate is irradiated with laser light under a plurality of conditions of energy densities, and then carbon concentration distribution and hydrogen concentration distribution in a depth direction of the single crystal semiconductor layer which has been irradiated with laser light are measured. Next, (n−1) single crystal semiconductor layers are irradiated with laser light at optimal energy density which is detected using the monitor substrate.

A pulsed laser is preferably used for irradiation with the laser light 113. This is because high-energy pulsed laser light can be emitted instantaneously and the partially melted state can be easily obtained. The repetition rate is preferably about greater than or equal to 1 Hz and less than or equal to 10 MHz, and more preferably, greater than or equal to 10 Hz and less than or equal to 1 MHz. As examples of the above-described pulsed laser, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like can be given. Note that the pulsed laser is preferably used for irradiation with the laser light 113, but an embodiment of the present invention should not be construed as being limited thereto. That is, the use of continuous wave lasers is not excluded. Note that, as examples of continuous wave lasers, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like can be given.

The wavelength of the laser light 113 needs to be a wavelength which is absorbed by the single crystal semiconductor layer 112. The wavelength may be determined in consideration of the penetration depth of laser light or the like. For example, in the case where the single crystal semiconductor layer 112 is a single crystal silicon layer, the wavelength can be in the range of greater than or equal to 200 nm and less than or equal to 700 nm. Further, the energy density of the laser light 113 can be determined in consideration of the wavelength of the laser light 113, the material of the single crystal semiconductor layer 112, the thickness of the single crystal semiconductor layer 112, or the like. The energy density of the laser light 113 can be set, for example, in the range of greater than or equal to 300 mJ/cm$^2$ and less than or equal to 800 mJ/cm$^2$. The method for detecting an optimal condition for laser light shown in Embodiment Mode 1 can also be applied to these conditions.

The irradiation with the laser light 113 can be performed in an atmosphere containing oxygen such as an air atmosphere or an inert atmosphere such as a nitrogen atmosphere. In order to perform the irradiation with the laser light 113 in an inert atmosphere, irradiation with the laser light 113 may be performed in an airtight chamber while the atmosphere in the chamber is controlled. In the case where the chamber is not used, a nitrogen atmosphere can be formed by blowing an inert gas such as a nitrogen gas to the surface which is irradiated with the laser light 113. In addition, the irradiation with the laser light 113 may be performed in vacuum.

After the irradiation with the laser light 113 is performed as described above, the thinning process in which the film thickness of the single crystal semiconductor layer 112 is reduced may be performed. In order to thin the single crystal semiconductor layer 112, one of dry etching and wet etching or a combination of both of the etchings (etch-back treatment) may be employed. For example, in the case where the single crystal semiconductor layer 112 is a layer formed using a silicon material, the single crystal semiconductor layer 112 can be thinned by dry etching treatment using $SF_6$ and $O_2$ as a process gas.

Note that, in this embodiment mode, an example is described in which etching treatment is performed after planarization or the like of the surface by irradiation with the laser light; however, the present invention should not be construed as being limited thereto. For example, etching treatment may be performed before irradiation with the laser light. In this case, the unevenness or the defects of the surface of the semiconductor layer can be reduced to some extent by the etching treatment. Alternatively, the etching treatment may be performed before and after irradiation with the laser light. Further alternatively, the laser light irradiation and the etching treatment may be alternately repeated. By using the laser light irradiation and the etching treatment in combination as just described, unevenness, defects, and the like of the surface of the semiconductor layer can be significantly reduced. Needless to say, it is not necessary that the above-described etching treatment, heat treatment, or the like is always performed.

Accordingly, the single crystal semiconductor layer 120 (single crystal silicon semiconductor layer) in which the planarity of the surface is improved and the defects are reduced can be manufactured (see FIG. 5F).

This embodiment mode can be implemented in combination with any of the other embodiment modes as appropriate.

Embodiment Mode 3

In this embodiment mode, a method for manufacturing a semiconductor device using the above-described semiconductor substrate is described with reference to FIGS. 6A to 6D and FIGS. 7A to 7D. Here, a method for manufacturing a semiconductor device including a plurality of transistors is described as an example of the semiconductor device. Note that various semiconductor devices can be formed with the use of transistors described below in combination.

Figure 6A:
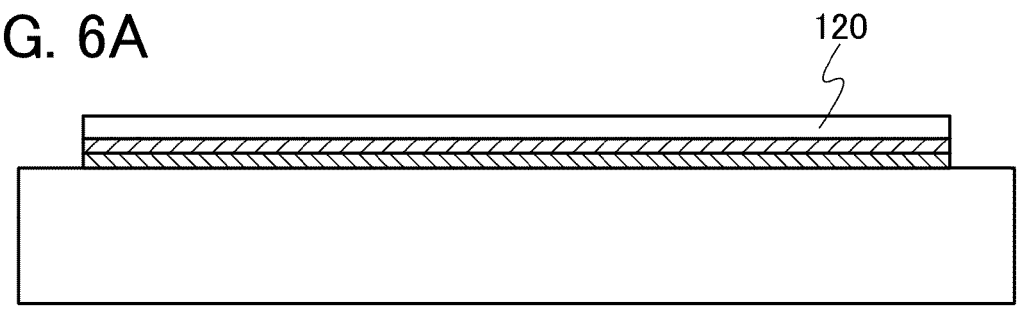
FIGS. 6A to 6D are diagrams illustrating a manufacturing process of a semiconductor device.
Figure 6B:
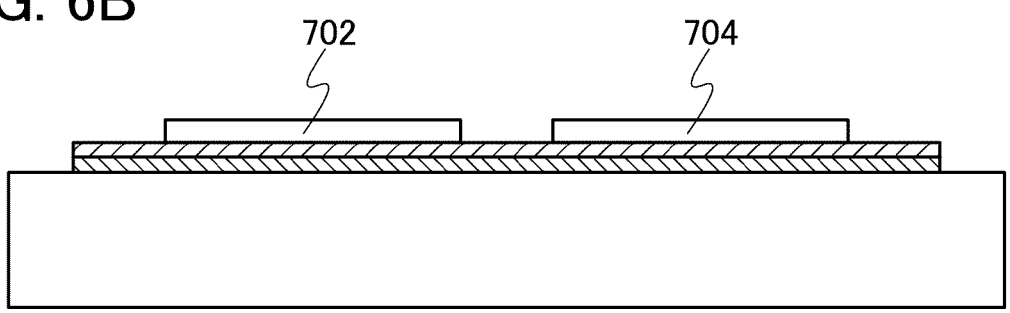

FIG. 6A is a cross-sectional view of a semiconductor substrate manufactured according to Embodiment Mode 2. Note that, in this embodiment mode, the case where the insulating layer 111 in Embodiment Mode 2 has a two-layer structure is described.

To control threshold voltages of TFTs, a p-type impurity such as boron, aluminum, or gallium or an n-type impurity such as phosphorus or arsenic may be added to the single crystal semiconductor layer 120. A region to which the impurity is added and the kind of the impurity to be added can be changed as appropriate. For example, a p-type impurity can be added to a formation region of an n-channel TFT, and an n-type impurity can be added to a formation region of a p-channel TFT. The above impurity may be added at a dose of about greater than or equal to $1\times10^{15}$ ions/cm$^2$ and less than or equal to $1\times10^{17}$ ions/cm$^2$. Then, the single crystal semiconductor layer 120 is separated into island shapes, whereby semiconductor layers 702 and 704 are formed (see FIG. 6B).

Figure 6C:
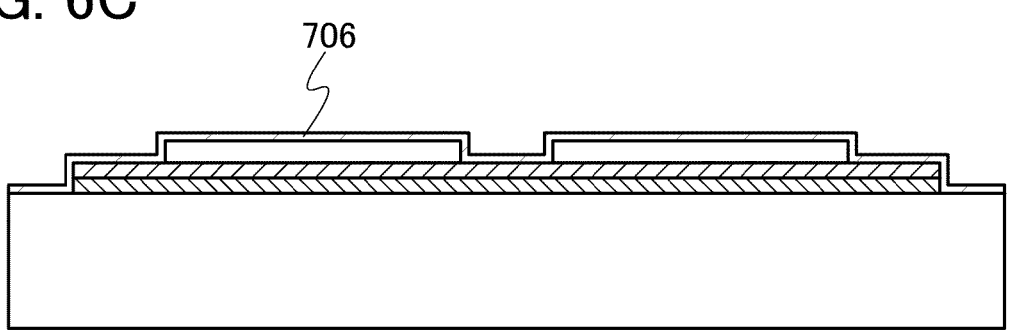

Next, a gate insulating layer 706 is formed so as to cover the semiconductor layers 702 and 704 (see FIG. 6C). Here, a silicon oxide film is formed as a single layer by a plasma CVD method. Alternatively, a film containing silicon oxynitride, silicon nitride oxide, silicon nitride, hafnium oxide, aluminum oxide, tantalum oxide, or the like may be formed with a single-layer structure or a stacked-layer structure as the gate insulating layer 706.

As a manufacturing method other than a plasma CVD method, a sputtering method or a method of oxidizing or nitriding by high-density plasma treatment can be given. High-density plasma treatment is performed by using, for example, a mixed gas of a rare gas such as helium, argon, krypton, or xenon; and a gas such as oxygen, nitrogen oxide, ammonia, nitrogen, or hydrogen. In this case, by exciting plasma by introduction of microwaves, plasma with a low electron temperature and high density can be generated. The surfaces of the semiconductor layers are oxidized or nitrided by oxygen radicals (OH radicals may be included) or nitrogen radicals (NH radicals may be included) which are generated by such high-density plasma, whereby the insulating layer is formed to a thickness of greater than or equal to 1 nm and less than or equal to 20 nm, desirably greater than or equal to 2 nm and less than or equal to 10 nm so as to be in contact with the semiconductor layers.

Since the semiconductor layers obtained by the high-density plasma treatment are oxided or nitrided by a solid-phase reaction, the interface state density between the gate insulating layer 706 and each of the semiconductor layers 702 and 704 can be drastically decreased. Further, the semiconductor layers are directly oxidized or nitrided by the high-density plasma treatment, whereby variation in the thickness of the insulating layers to be formed can be suppressed. Since the semiconductor layers have crystallinity, even when surfaces of the semiconductor layers are oxidized by a solid-phase reaction by using the high-density plasma treatment, nonuniform oxidation in a crystal grain boundary can be suppressed; thus, a gate insulating layer with favorable uniformity and a low interface state density can be formed. When an insulating layer formed by high-density plasma treatment as described above is used for part of or the entire gate insulating layer of a transistor, variation in characteristic of transistors can be suppressed.

A more specific example of manufacturing method of the insulating layer by plasma treatment will be described. The surfaces of the semiconductor layers 702 and 704 are oxidized or nitrided in such a manner that nitrous oxide ($N_2O$) is diluted to be greater than or equal to 1 time and less than or equal to 3 times (the flow ratio) with argon (Ar) and a microwave power (2.45 GHz) greater than or equal to 3 kW and less than or equal to 5 kW is applied under a pressure greater than or equal to 10 Pa and less than or equal to 30 Pa. By this treatment, a lower layer of the gate insulating layer 706 with a thickness greater than or equal to 1 nm and less than or equal to 10 nm (preferably, greater than or equal to 2 nm and less than or equal to 6 nm) is formed. Further, a silicon oxynitride film is formed as an upper layer of the gate insulating layer 706 by a vapor-phase growth method in such a manner that nitrous oxide ($N_2O$) and silane ($SiH_4$) are introduced and a microwave power (2.45 GHz) greater than or equal to 3 kW and less than or equal to 5 kW is applied under a pressure greater than or equal to 10 Pa and less than or equal to 30 Pa. The gate insulating layer 706 is formed by combining solid phase reaction and a vapor-phase growth method as described above, whereby the gate insulating layer 706 with a low interface state density and excellent dielectric strength can be formed. Note that, in this case, the gate insulating layer 706 has a two-layer structure.

Alternatively, the gate insulating layer 706 may be formed by thermally oxidizing the semiconductor layers 702 and 704. In the case of forming the gate insulating layer 706 by such thermal oxidation, a base substrate with a comparatively high heat resistance is preferably used.

Further alternatively, hydrogen contained in the gate insulating layer 706 may be dispersed in the semiconductor layers 702 and 704 by performing heat treatment at a temperature higher than or equal to 350° C. and lower than or equal to 450° C. after the gate insulating layer 706 containing hydrogen is formed. In this case, the gate insulating layer 706 may be formed by using silicon nitride or silicon nitride oxide by a plasma CVD method. Further, in this case, a process temperature is set to less than or equal to 350° C. In this manner, hydrogen is supplied to the semiconductor layers 702 and 704, whereby defects in the semiconductor layers 702 and 704, at an interface between the gate insulating layer 706 and the semiconductor layer 702, and at an interface between the gate insulating layer 706 and the semiconductor layer 704 can be effectively reduced.

Figure 6D:
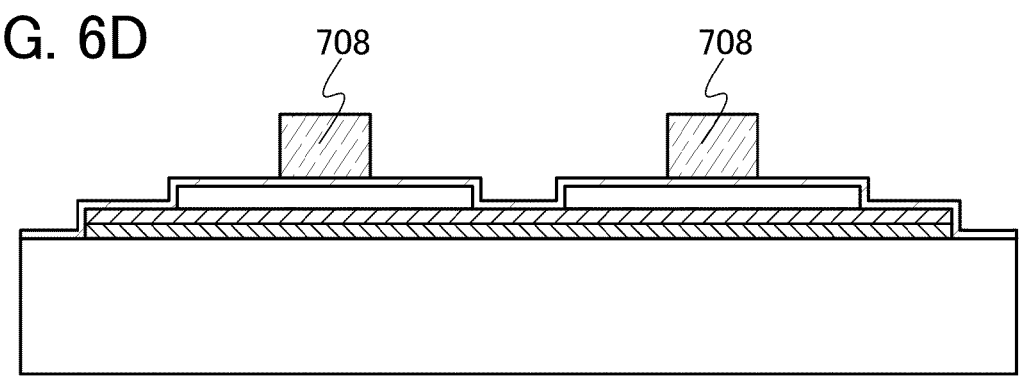

Next, a conductive layer is formed over the gate insulating layer 706, and then the conductive layer is processed (patterned) into a predetermined shape, whereby electrodes 708 are formed over the semiconductor layers 702 and 704 (see FIG. 6D). The conductive layer can be formed by a CVD method, a sputtering method, or the like. The conductive layer can be formed from a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Further alternatively, a semiconductor material such as polycrystalline silicon, which is obtained by doping a semiconductor with an impurity element that imparts conductivity, or the like may be used.

Although the electrodes 708 are formed as a single-layer conductive layer in this embodiment mode, the semiconductor device is not limited to the structure. The electrodes 708 may be formed as a plurality of stacked conductive layers. In the case of a two-layer structure, for example, a molybdenum film, a titanium film, a titanium nitride film, or the like may be used as a lower layer, and an aluminum film or the like may be used as an upper layer. In the case of a three-layer structure, a stacked-layer structure of a molybdenum film, an aluminum film, and a molybdenum film; a stacked-layer structure of a titanium film, an aluminum film, and a titanium film; or the like may be used.

Note that a mask used for forming the electrodes 708 may be formed using a material such as silicon oxide or silicon nitride oxide. In this case, a process for forming a mask by patterning a silicon oxide film, a silicon nitride oxide film, or the like is additionally needed; however, the amount of the reduced film thickness of the mask in etching is smaller than the resist material; thus, the electrodes 708 with an accurate shape can be formed. Alternatively, the electrodes 708 may be selectively formed by a droplet discharge method without using the masks. Here, a droplet discharge method refers to a method in which droplets containing a predetermined composition are discharged or ejected to form a predetermined pattern, and includes an ink-jet method and the like in its category.

Alternatively, the electrodes 708 can be formed by etching the conductive layer to have a desired tapered shape by an inductively coupled plasma (ICP) etching method with appropriate adjustment of the etching conditions (e.g., the amount of electric power applied to a coiled electrode layer, the amount of electric power applied to an electrode layer on the substrate side, the electrode temperature on the substrate side, and the like). The tapered shape can be adjusted according to the shape of the mask. Note that, as an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate.

Figure 7A:
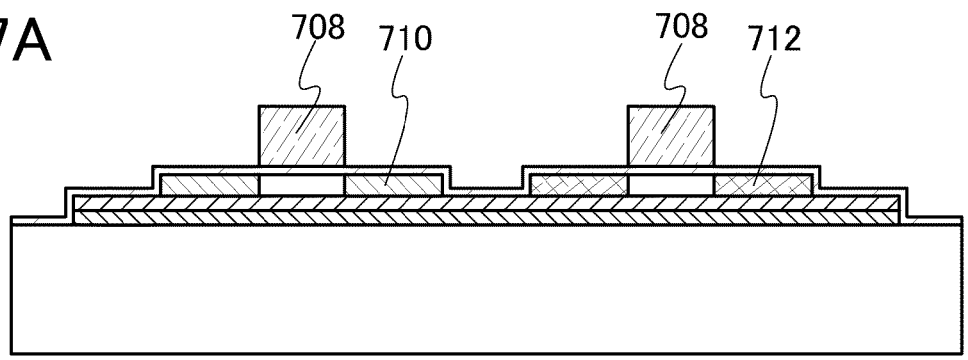
FIGS. 7A to 7D are diagrams illustrating a manufacturing process of a semiconductor device.

Next, an impurity element imparting one conductivity type is added to the semiconductor layers 702 and 704 using the electrodes 708 as masks (see FIG. 7A). In this embodiment mode, an impurity element imparting n-type conductivity (for example, phosphorus or arsenic) is added to the semiconductor layer 702, and an impurity element imparting p-type conductivity (for example, boron) is added to the semiconductor layer 704. Note that when the impurity element imparting n-type conductivity is added to the semiconductor layer 702, the semiconductor layer 704 to which the impurity element imparting p-type conductivity is added is covered with a mask or the like so that the impurity element imparting n-type conductivity is added selectively. Further, when the impurity element imparting p-type conductivity is added to the semiconductor layer 704, the semiconductor layer 702 to which the impurity element imparting n-type conductivity is added is covered with a mask or the like so that the impurity element imparting p-type conductivity is added selectively. Alternatively, after one of an impurity element imparting p-type conductivity and an impurity element imparting n-type conductivity is added to the semiconductor layers 702 and 704, the other of the impurity element imparting p-type conductivity and the impurity element imparting n-type conductivity may be added only to one of the semiconductor layers at a higher concentration. By the addition of the impurity, impurity regions 710 and impurity regions 712 are formed in the semiconductor layer 702 and the semiconductor layer 704, respectively.

Figure 7B:
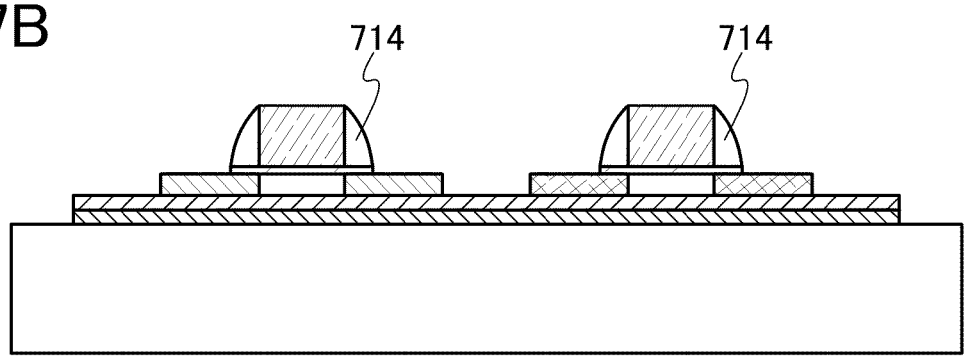

Next, sidewalls 714 are formed on side surfaces of the electrodes 708 (see FIG. 7B). The sidewalls 714 can be formed by, for example, newly forming an insulating layer so as to cover the gate insulating layer 706 and the electrodes 708 and by partially etching the newly-formed insulating layer by anisotropic etching mainly in a perpendicular direction. Note that the gate insulating layer 706 may also be etched partially by the anisotropic etching described above. As the insulating layer for forming the sidewalls 714, a film containing silicon, silicon oxide, silicon nitride, silicon oxynitride, silicon nitride oxide, an organic material, or the like may be formed to have a single-layer structure or a stacked-layer structure by a plasma CVD method, a sputtering method, or the like. In this embodiment mode, a 100-nm-thick silicon oxide film is formed by a plasma CVD method. In addition, as an etching gas, a mixed gas of $CHF_3$ and helium can be used. Note that a process for forming the sidewalls 714 is not limited thereto.

Figure 7C:
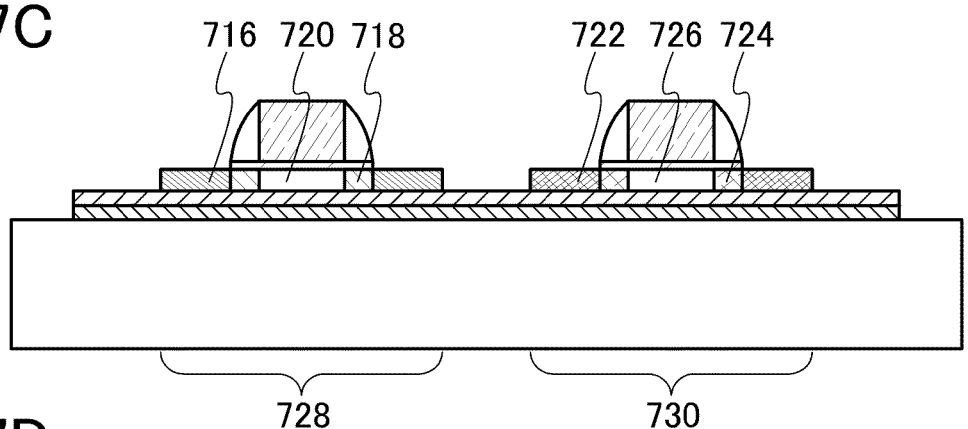

Next, an impurity element imparting one conductivity type is added to the semiconductor layers 702 and 704 using the gate insulating layer 706, the electrodes 708, and the sidewalls 714 as masks (see FIG. 7C). Note that the impurity element imparting the same conductivity type as the impurity element which has been added to the semiconductor layers 702 and 704 in the previous process is added to the semiconductor layers 702 and 704 at a higher concentration. Note that when the impurity element imparting n-type conductivity is added to the semiconductor layer 702, the semiconductor layer 704 to which the impurity element imparting p-type conductivity is added is covered with a mask or the like so that the impurity element imparting n-type conductivity is added selectively. Further, when the impurity element imparting p-type conductivity is added to the semiconductor layer 704, the semiconductor layer 702 to which the impurity element imparting n-type conductivity is added is covered with a mask or the like so that the impurity element imparting p-type conductivity is added selectively.

By the above-described addition of the impurity element, a pair of high-concentration impurity regions 716, a pair of low-concentration impurity regions 718, and a channel formation region 720 are formed in the semiconductor layer 702. In addition, by the above-described addition of the impurity element, a pair of high-concentration impurity regions 722, a pair of low-concentration impurity regions 724, and a channel formation region 726 are formed in the semiconductor layer 704. The high-concentration impurity regions 716 and the high-concentration impurity regions 722 each serve as a source region or a drain region, and the low-concentration impurity regions 718 and the low-concentration impurity regions 724 each serve as an LDD (lightly doped drain) region.

Note that the sidewalls 714 formed over the semiconductor layer 702 and the sidewalls 714 formed over the semiconductor layer 704 may be formed so as to have the same length in a direction where carriers move (a direction parallel to a so-called channel length), or may be formed so as to have different lengths. The length of each of the sidewalls 714 over the semiconductor layer 704 which constitutes a part of a p-channel transistor may be larger than the length of each of the sidewalls 714 over the semiconductor layer 702 which constitutes a part of an n-channel transistor. This is because boron which is added for forming a source region and a drain region in the p-channel transistor is easily diffused and a short channel effect is easily induced. By increasing the length of each of the sidewalls 714 of the p-channel transistor, boron can be added to the source region and the drain region at high concentration, whereby the resistance of the source region and the drain region can be reduced.

A silicide layer in which silicide is formed in part of the semiconductor layers 702 and 704 may be formed in order to further reduce the resistance of the source region and the drain region. The silicide is formed by placing metal in contact with the semiconductor layers and causing a reaction between the metal and silicon in the semiconductor layers by heat treatment (e.g., a GRTA method, an LRTA method, or the like). The silicide layer may be formed using cobalt silicide or nickel silicide. In the case where the semiconductor layers 702 and 704 are thin, silicide reaction may proceed to bottoms of the semiconductor layers 702 and 704. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, the silicide layer can also be formed by laser light irradiation or the like.

Through the processes described above, an n-channel transistor 728 and a p-channel transistor 730 are formed. Note that although conductive layers each serving as a source electrode or a drain electrode are not formed in a stage shown in FIG. 7C, a structure including these conductive layers each serving as a source electrode or a drain electrode may also be referred to as a transistor.

Figure 7D:
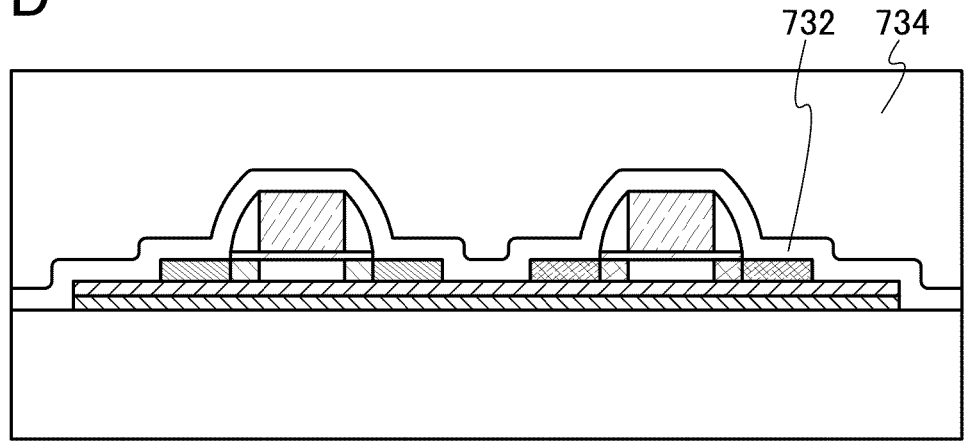

Next, an insulating layer 732 is formed so as to cover the n-channel transistor 728 and the p-channel transistor 730 (see FIG. 7D). The insulating layer 732 is not always necessary; however, the formation of the insulating layer 732 can prevent impurities such as alkali metal or alkaline-earth metal from penetrating the n-channel transistor 728 and the p-channel transistor 730. In specific, the insulating layer 732 is desirably formed from a material such as silicon oxide, silicon nitride, silicon oxynitride, silicon nitride oxide, aluminum nitride, aluminum oxide, or the like. In this embodiment mode, the insulating layer 732 is formed of a silicon nitride oxide film with a thickness of about 600 nm. In this case, the above-described hydrogenation process may be performed after the silicon nitride oxide film is formed. Note that although the insulating layer 732 is formed to have a single-layer structure in this embodiment mode, it is needless to say that the insulating layer 732 may have a stacked-layer structure. For example, in the case of a two-layer structure, the insulating layer 732 may have a stacked-layer structure of a silicon oxynitride film and a silicon nitride oxide film.

Next, an insulating layer 734 is formed over the insulating layer 732 so as to cover the n-channel transistor 728 and the p-channel transistor 730. The insulating layer 734 may be formed using an organic material having resistance against heat, such as polyimide, acrylic, benzocyclobutene, polyamide, or epoxy. In addition to such organic materials, it is also possible to use a low-dielectric constant material (a low-k material), a siloxane-based resin, silicon oxide, silicon nitride, silicon oxynitride, silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include one selected from fluorine, an alkyl group, and aromatic hydrocarbon, as well as hydrogen, as a substituent. Alternatively, the insulating layer 734 may be formed by stacking a plurality of insulating layers formed using any of these materials.

The insulating layer 734 can be formed by any of the following methods and means depending on the material of the insulating layer 734: a CVD method, a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, and the like.

Next, contact holes are formed in the insulating layers 732 and 734 so that each of the semiconductor layers 702 and 704 is partially exposed. Then, conductive layers 736 and conductive layers 738 are formed to be in contact with the semiconductor layer 702 and the semiconductor layer 704, respectively, through the contact holes (see FIG. 8A). The conductive layers 736 and the conductive layers 738 each serve as a source electrode or a drain electrode of a transistor. Note that, in this embodiment mode, as an etching gas for forming the contact holes, a mixed gas of $CHF_3$ and He is employed; however, the etching gas is not limited thereto.

The conductive layers 736 and the conductive layers 738 can be formed by a CVD method, a sputtering method, or the like. Specifically, the conductive layers 736 and the conductive layers 738 can be formed using aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-described material as its main component or a compound containing the above-described material may be used. The conductive layers 736 and the conductive layers 738 may each have a single-layer structure or a stacked-layer structure.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Since aluminum and aluminum silicon (Al—Si) have low resistance and are inexpensive, aluminum and aluminum silicon are suitable as a material for forming the conductive layers 736 and the conductive layers 738. In particular, the aluminum silicon is preferable because a hillock can be prevented from generating in resist baking at the time of patterning. Further, a material in which Cu is mixed into aluminum at approximately 0.5% may be used instead of silicon.

In the case where each of the conductive layers 736 and the conductive layers 738 is formed to have a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be employed, for example. Note that the barrier film refers to a film formed using titanium, a nitride of titanium, molybdenum, a nitride of molybdenum, or the like. By forming the conductive layers so as to sandwich an aluminum silicon film between the barrier films, generation of hillocks of aluminum or aluminum silicon can be further prevented. Moreover, by forming the barrier film using titanium that is a highly reducible element, even if a thin oxide film is formed over the semiconductor layers 702 and 704, the oxide film is reduced by the titanium contained in the barrier film, whereby preferable contact between the conductive layers 736 and the semiconductor layer 702 and between the conductive layers 738 and the semiconductor layer 704 can be obtained. Further, it is also possible to stack a plurality of barrier films. In that case, for example, each of the conductive layers 736 and the conductive layers 738 can be formed to have a five-layer structure of titanium, titanium nitride, aluminum silicon, titanium, and titanium nitride in order from the bottom or a stacked-layer structure of more than the five layers.

As the conductive layers 736 and the conductive layers 738, tungsten silicide formed by a chemical vapor deposition method using a $WF_6$ gas and a $SiH_4$ gas may be used. Alternatively, tungsten formed by hydrogen reduction of $WF_6$ may be used as the conductive layers 736 and the conductive layers 738.

Note that the conductive layers 736 are connected to the high-concentration impurity regions 716 of the n-channel transistor 728. The conductive layers 738 are connected to the high-concentration impurity regions 722 of the p-channel transistor 730.

Figure 8A:
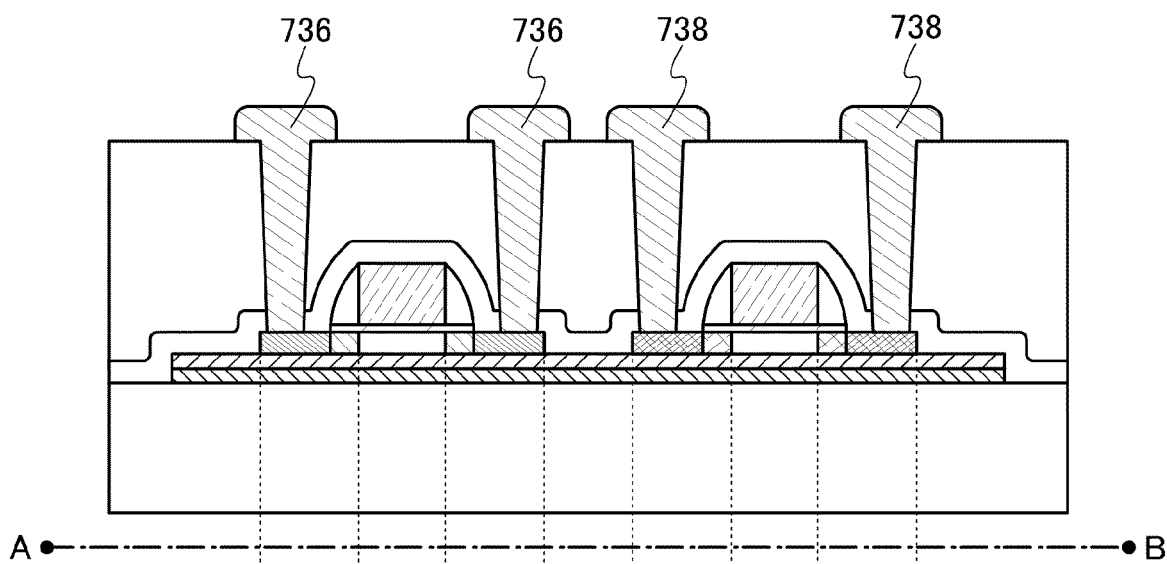
FIGS. 8A and 8B are a plan view and a cross-sectional view of a semiconductor device, respectively.
Figure 8B:
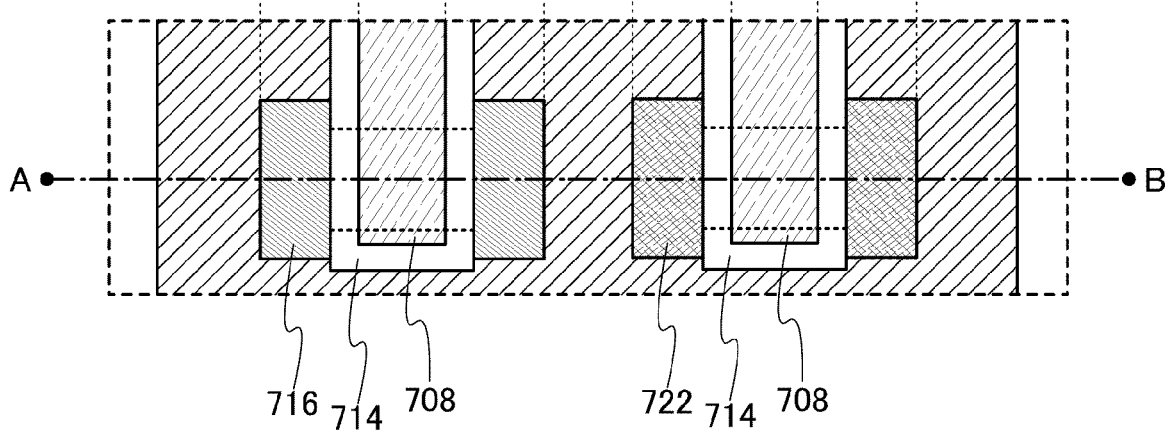

FIG. 8B illustrates a plan view of the n-channel transistor 728 and the p-channel transistor 730 which are illustrated in FIG. 8A. Here, a cross section taken along a line A-B in FIG. 8B corresponds to FIG. 8A. However, in FIG. 8B, the conductive layers 736, the conductive layers 738, the insulating layers 732 and 734, and the like are omitted for simplicity.

Note that although this embodiment mode describes as an example the case where each of the n-channel transistor 728 and the p-channel transistor 730 includes one electrode 708 serving as the gate electrode, this embodiment mode is not limited to this structure. For example, the transistor which is manufactured may have a multi-gate structure in which a plurality of electrodes serving as gate electrodes are provided and electrically connected to one another.

In this embodiment mode, surface unevenness and defects of a single crystal semiconductor layer are reduced by laser light irradiation instead of performing mechanical polishing or the like. Further, by using Embodiment Mode 1, optimization of condition for laser light irradiation is achieved by an extremely simple method. Thus, a semiconductor substrate in which defects are reduced sufficiently and surface planarity is excellent can be provided, and cost thereof can be suppressed. Accordingly, a transistor which can be operated at high speed and driven at low voltage and has a low subthreshold value and high field-effect mobility can be manufactured at low cost by using the semiconductor substrate.

This embodiment mode can be implemented in combination with any of the other embodiment modes as appropriate.

Embodiment Mode 4

A semiconductor device such as a transistor using a semiconductor substrate shown in the above embodiment mode is manufactured, and various electronic devices can be completed using this semiconductor device. Since the single crystal semiconductor layer which is provided in the semiconductor substrate shown in Embodiment Mode 2 has high planarity, a gate insulating layer which is thin and has high withstand voltage can be formed over the single crystal semiconductor layer, and then improvement of mobility and suppression of a short channel effect of a semiconductor element which is formed can be achieved. That is, with use of the semiconductor substrate shown in Embodiment Mode 2, a highly-reliable semiconductor element having high current driving capability can be formed. As a result, electronic devices as end products can be manufactured with high throughput and high product quality. In this embodiment mode, specific application examples to electronic devices are described with reference to drawings.

As an electronic device manufactured using a semiconductor device particularly, a display device), cameras such as a video camera and a digital camera, a goggle type display (a head mounted display), a navigation system, an audio reproducing device (a car audio set or the like), a computer, a game machine, a portable information terminal (a mobile computer, a cellular phone, a portable game machine, an electronic book reader, or the like), an image reproducing device provided with a storage medium (specifically, a device provided with a display that can reproduce a storage medium such as a digital versatile disc (DVD) and display the image), and the like can be given.

Figure 9A:
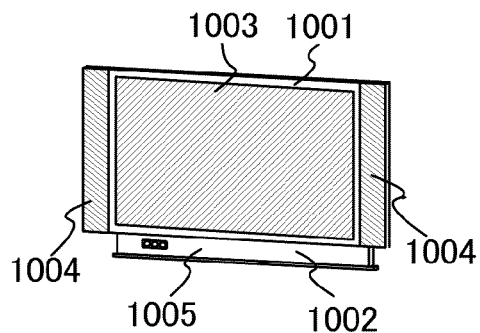
FIGS. 9A to 9H are diagrams each illustrating an electronic device using a semiconductor device.

FIG. 9A illustrates a television set or a monitor of a personal computer, which includes a housing 1001, a support stand 1002, a display portion 1003, a speaker portion 1004, a video input terminal 1005, and the like. A semiconductor device shown in the above embodiment mode is used for the display portion 1003, and a highly-reliable and high-performance television set or monitor of a personal computer can be provided at low cost.

Figure 9B:
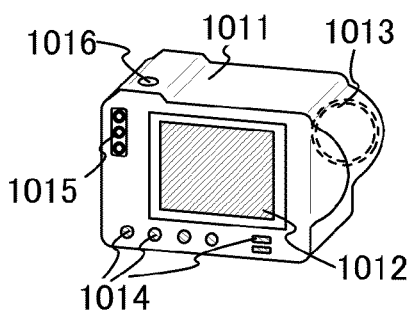

FIG. 9B illustrates a digital camera. An image receiving portion 1013 is provided in the front side of a main body 1011.

A shutter button 1016 is provided at the upper portion of the main body 1011. A display portion 1012, operation keys 1014, and an external connection port 1015 are provided at the backside of the main body 1011. A semiconductor device shown in the above embodiment mode is used for the display portion 1012, and a high-performance and highly-reliable digital camera can be provided at low cost.

Figure 9C:
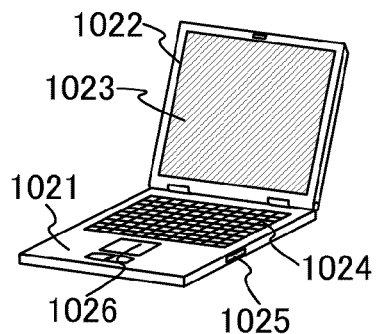

FIG. 9C illustrates a notebook personal computer. A main body 1021 is provided with a keyboard 1024, an external connection port 1025, and a pointing device 1026. A housing 1022 including a display portion 1023 is attached to the main body 1021. A semiconductor device shown in the above embodiment mode is used for the display portion 1023, and a high-performance and highly-reliable notebook personal computer can be provided at low cost.

Figure 9D:
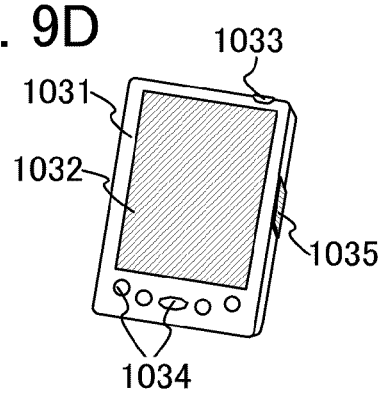

FIG. 9D illustrates a mobile computer, which includes a main body 1031, a display portion 1032, a switch 1033, operation keys 1034, an infrared port 1035, and the like. An active matrix display device is provided in the display portion 1032. A semiconductor device shown in the above embodiment mode is used for the display portion 1032, and a high-performance and highly-reliable mobile computer can be provided at low cost.

Figure 9E:
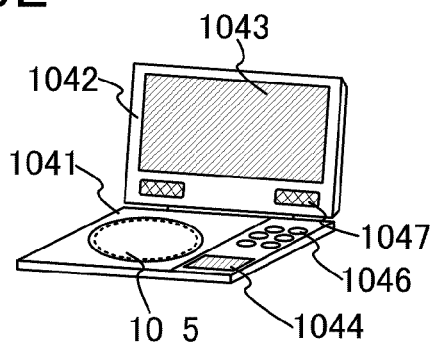

FIG. 9E illustrates an image reproducing device. A main body 1041 is provided with a display portion B 1044, a recording medium reading portion 1045, and operation keys 1046. A housing 1042 including a speaker portion 1047 and a display portion A 1043 is attached to the main body 1041. A semiconductor device shown in the above embodiment mode is used for each of the display portion A 1043 and the display portion B 1044, and a high-performance and highly-reliable image reproducing device can be provided at low cost.

Figure 9F:
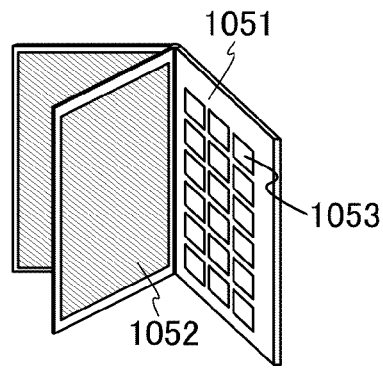

FIG. 9F illustrates an electronic book reader. A main body 1051 is provided with operation keys 1053. A plurality of display portions 1052 are attached to the main body 1051. A semiconductor device shown in the above embodiment mode is used for the display portions 1052, and a high-performance and highly-reliable electronic book reader can be provided at low cost.

Figure 9G:
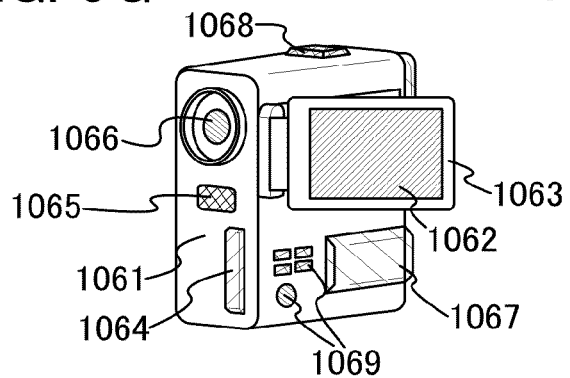

FIG. 9G illustrates a video camera. A main body 1061 is provided with an external connection port 1064, a remote control receiving portion 1065, an image receiving portion 1066, a battery 1067, an audio input portion 1068, and operation keys 1069. A housing 1063 including a display portion 1062 is attached to the main body 1061. A semiconductor device shown in the above embodiment mode is used for the display portion 1062, and a high-performance and highly-reliable video camera can be provided at low cost.

Figure 9H:
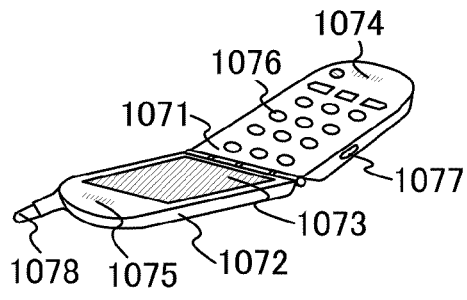

FIG. 9H illustrates a cellular phone, which includes a main body 1071, a housing 1072, a display portion 1073, an audio input portion 1074, an audio output portion 1075, operation keys 1076, an external connection port 1077, an antenna 1078, and the like. A semiconductor device shown in the above embodiment mode is used for the display portion 1073, and a high-performance and highly-reliable cellular phone can be provided at low cost.

Figure 10A:
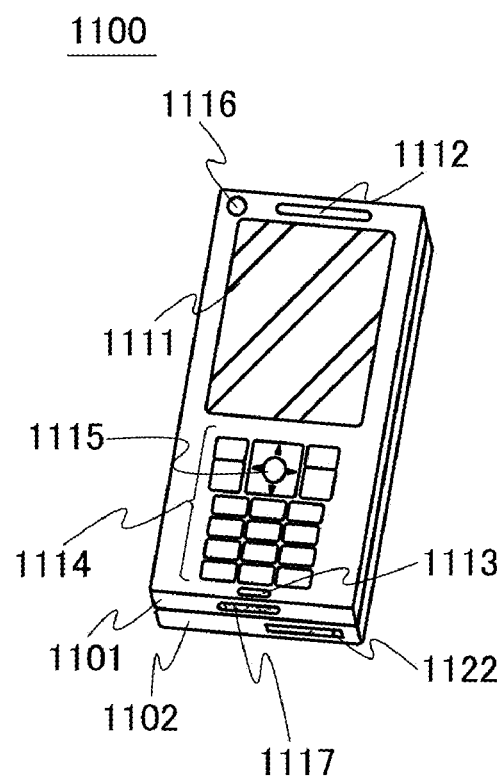
FIGS. 10A to 10C are diagrams illustrating an electronic device using a semiconductor device.
Figure 10B:
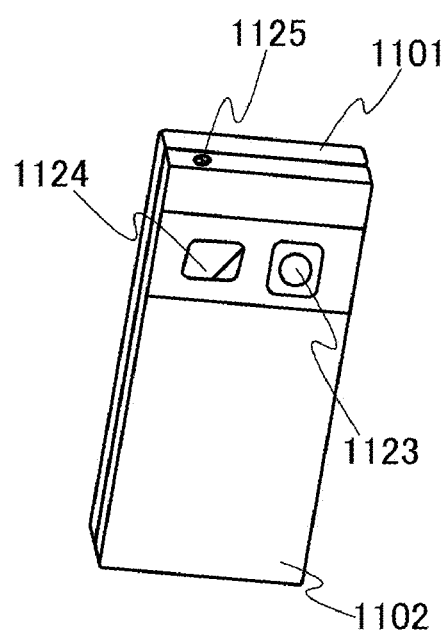
Figure 10C:
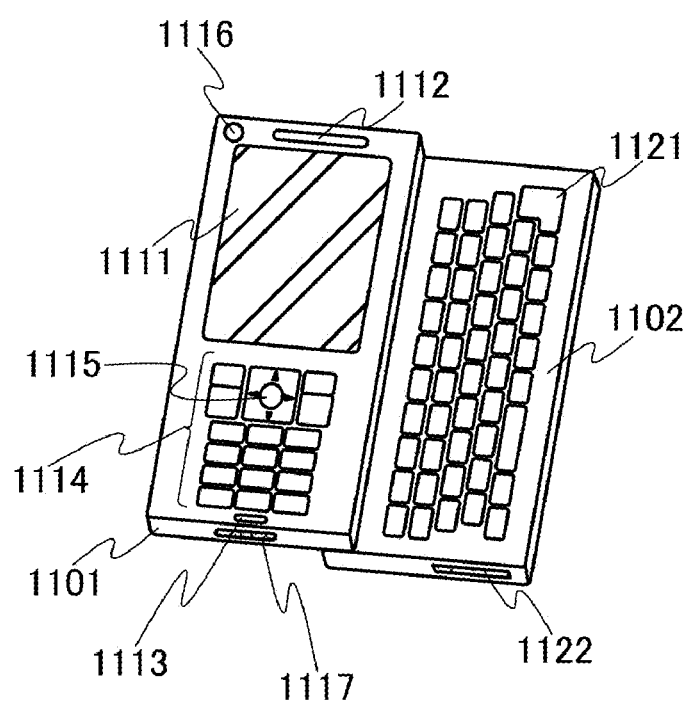

FIGS. 10A to 10C illustrate a structural example of a portable electronic device 1100 having functions as a telephone and an information terminal. FIG. 10A is a front view, FIG. 10B is a back view, and FIG. 10C is a development view. The portable electronic device 1100 has functions as both a telephone and an information terminal and is an electronic device so-called a smartphone which is capable of various data processing in addition to voice call.

The portable electronic device 1100 includes a housing 1101 and a housing 1102. The housing 1101 includes a display portion 1111, a speaker 1112, a microphone 1113, operation keys 1114, a pointing device 1115, a camera lens 1116, an external connection terminal 1117, and the like, while the housing 1102 includes a keyboard 1121, an external memory slot 1122, a camera lens 1123, a light 1124, an earphone terminal 1125, and the like. In addition, an antenna is incorporated in the housing 1101. In addition to the above structure, the portable electronic device may incorporate a non-contact IC chip, a small-sized memory device, or the like.

The semiconductor device shown in the above embodiment mode is incorporated in the display portion 1111. Note that an image displayed (and direction in which the image is displayed) in the display portion 1111 variously changes depending on a usage pattern of the portable electronic device 1100. Moreover, since the display portion 1111 and the camera lens 1116 are provided on the same surface, voice call (so-called videophone) with images is possible. Note that the speaker 1112 and the microphone 1113 can be used not only for voice call but also for recording, reproducing, or the like. In the case where a still image and a moving image are shot by using the camera lens 1123 (and the light 1124), the display portion 1111 is used as a finder. The operation keys 1114 are used for incoming/outgoing of phone call, inputting simple information such as e-mail, screen scrolling, moving cursor, and the like.

Furthermore, the housing 1101 and the housing 1102 (FIG. 10A), which are overlapped with each other, are developed by sliding as show in FIG. 10C and the portable electronic device can be used as a portable information terminal. In this case, smooth operation can be conducted using the keyboard 1121 and the pointing device 1115. The external connection terminal 1117 can be connected to an AC adaptor and various types of cables such as a USB cable, and charging, data communication with a computer, and the like are possible. Furthermore, a large amount of data can be stored and moved by inserting a storage medium into the external memory slot 1122. In addition to the above functions, the portable electronic device may include an infrared communication function using electromagnetic waves such as infrared rays, a television receiving function, or the like. By using a semiconductor device shown in the above embodiment mode, a high-performance and highly-reliable portable electronic device can be provided at low cost.

As described above, the application range of this embodiment mode is extremely wide; therefore, this embodiment mode can be applied to electronic devices of various fields. Note that this embodiment mode can be implemented in combination with any of the other embodiment modes as appropriate.

Embodiment 1

In this embodiment, evaluation results of crystallinity of a single crystal semiconductor layer which is irradiated with laser light under conditions A to C and has concentration distributions shown in FIGS. 2A and 2B using an EBSP (electron backscatter diffraction pattern) method are described.

In this embodiment, similarly to the single crystal semiconductor layer 112 which is described in Embodiment Mode 1 with reference to FIG. 1, a single crystal semiconductor layer is provided over a non-alkali glass substrate (product name: AN100) having a thickness of 0.7 mm with an insulating film which is interposed therebetween and in which a silicon oxide film, a silicon nitride oxide film, and a silicon oxynitride film are stacked such that each film has a thickness of 50 nm. The thickness of the single crystal semiconductor layer is 100 nm.

As a single crystal semiconductor substrate for manufacturing the single crystal semiconductor layer, a single crystal silicon wafer is used. The single crystal silicon wafer is a square substrate with 5 inches square. The conductivity type is a p-type, and the resistivity is about 10 Ω·cm. In addition, a main surface of the single crystal silicon wafer is oriented along the (100) plane, and a side surface thereof is oriented along the <110> plane.

Further, the silicon oxynitride film, the silicon nitride oxide film, and the silicon oxide film were formed using a PECVD method. A process gas for formation of the silicon oxynitride film is $SiH_4$ and $N_2O$, and the flow ratio is $SiH_4\backslash N_2O=4\backslash 800$. The substrate temperature in the film formation process is 400° C. A process gas for formation of the silicon nitride oxide film is $SiH_4$, $NH_3$, $N_2O$, and $H_2$, and the flow ratio is $SiH_4\backslash NH_3\backslash N_2O\backslash H_2=10\backslash 100\backslash 20\backslash 400$. The temperature in the film formation process is 350° C. For a process gas for forming the silicon oxide film, TEOS and $O_2$ are used. The flow ratio is $TEOS\backslash O_2=15\backslash 750$. The temperature in the film formation process is 300° C.

In order to form an embrittlement layer in the single crystal silicon wafer, hydrogen ions are added to the single crystal silicon wafer by using an ion doping apparatus. A 100% hydrogen gas was used as a source gas, and the single crystal silicon wafer was irradiated with ions in plasma that has been generated by excitation of the hydrogen gas and accelerated by an electric field without mass separation. Accordingly, an embrittlement layer was formed. In the ion doping apparatus, when the hydrogen gas is excited, three kinds of ion species, $H^+$, $H_2^+$, and $H_3^+$, are generated, and all of the ion species are accelerated, with which the single crystal silicon wafer is irradiated Approximately 80% of the hydrogen ion species that are generated from the hydrogen gas is $H_3^+$.

In this embodiment, the hydrogen ion doping was performed under the following conditions: the power supply output was 100 W; the accelerating voltage, 40 kV; and the dose, $2.2\times10^{16}$ ions/cm$^3$.

After the glass substrate and the single crystal silicon wafer provided with the insulating layers were subjected to ultrasonic cleaning in pure water and were then cleaned with ozone-containing pure water, the surface of the glass substrate and the silicon oxide film formed over the surface of the single crystal silicon wafer were disposed in contact with each other and bonded to each other. Next, in order to cause cleavage along the embrittlement layer, heat treatment was performed at 200° C. for 2 hours in a heating furnace to increase bonding strength between the glass substrate and the silicon oxide film. Heating was successively performed at 600° C. for 4 hours in the heating furnace. Accordingly, the single crystal silicon wafer was cleaved, and the single crystal silicon layer was separated from the single crystal silicon wafer.

Figure 11C:
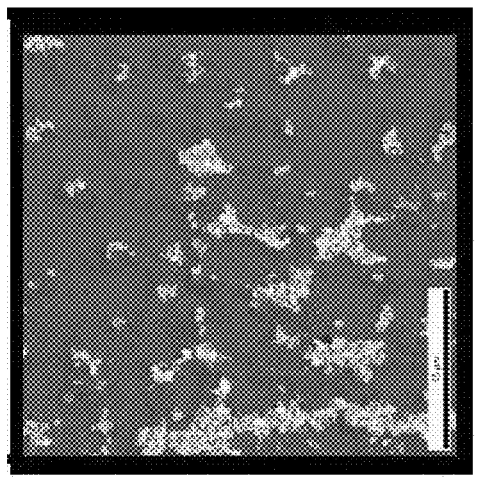
FIGS. 11A to 11D are diagrams showing a surface of a single crystal semiconductor layer after recrystallization, which is measured by an EBSP method.
Figure 11B:
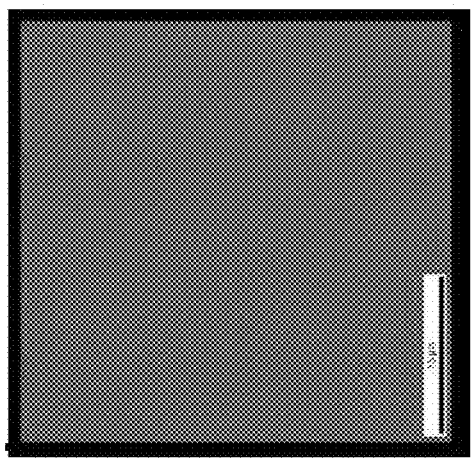
Figure 11A:
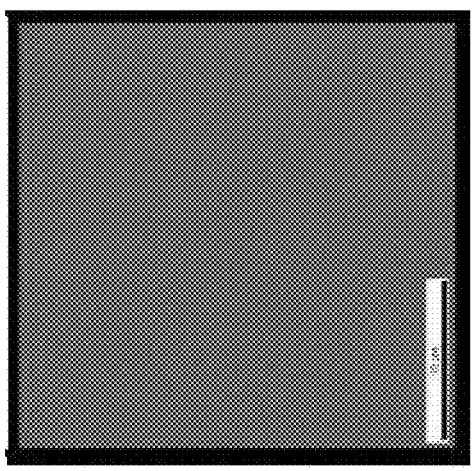
Figure 11D:
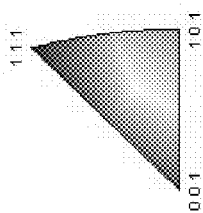

Next, the single crystal silicon layer was treated with a 100-fold diluted hydrofluoric acid to remove a natural oxide film that was formed on the surface. Then, the single crystal silicon layer was irradiated with laser light, so that the single crystal silicon layer was melted and recrystallized. As a laser, a XeCl excimer laser which emits a beam at a wavelength of 308 nm was used. The pulse width of the laser beam is 25 nsec and the repetition rate is 30 Hz. As described above, laser light irradiation treatment was performed under three kinds of conditions (conditions A to C) of laser light at different energy densities on three regions of the single crystal semiconductor layer 112. The conditions A to C are as follows.
Condition A: 568 mJ/cm$^2$
Condition B: 584 mJ/cm$^2$
Condition C: 600 mJ/cm$^2$ The crystallinity of the single crystal semiconductor layer 112 which has been irradiated with the laser light 113 was measured by an EBSP method, and FIGS. 11A to 11D show the measurement results. In this measurement, the measurement range was 40 μm×40 μm. FIG. 11A shows distribution of crystal orientations of a region of the single crystal semiconductor layer 112 which has been irradiated with the laser light 113 under the condition A; FIG. 11B, under the condition B; and the FIG. 11C, under the condition C. FIGS. 11A to 11C show distribution in a direction perpendicular to the single crystal semiconductor layer 112. FIG. 11D shows plane orientation of FIGS. 11A to 11C.

As shown in FIGS. 11A to 11D, crystal orientations of the regions of the single crystal semiconductor layer 112 which have been irradiated with the laser light 113 under the conditions A and B are aligned substantially in one direction and regarded as single crystals. As described above, the conditions A and B are conditions where a local maximum of a carbon concentration is observed in the element concentration distribution in the depth direction of the single crystal semiconductor layer after recrystallization. That is, the conditions A and B are conditions where the single crystal semiconductor layer is in a partially melted state. On the other hand, in the region of the single crystal semiconductor layer 112 which has been irradiated with the laser light 113 under the condition C, many crystal defects are observed, and microcrystallized regions are partially present. This is because it can be judged that disordered nucleation is generated after the single crystal semiconductor layer is completely melted into a liquid phase in the case where the laser light irradiation is performed under the condition C.

As the results described above show, the crystallinity of the single crystal semiconductor layer is favorable when laser light irradiation is performed under a condition where a region of a single crystal semiconductor layer which has been irradiated with laser light is in a partially melted state, that is, a condition where a local maximum of a carbon concentration is observed in element concentration distribution in a depth direction of the single crystal semiconductor layer after recrystallization.

Embodiment 2

In this embodiment, surface planarity of a single crystal semiconductor layer which has been irradiated with laser light under four kinds of conditions (conditions A', A, B, and C') of laser light at different energy densities was evaluated with measured values that represent surface roughness and that are obtained by analysis of images observed with an atomic force microscope (AFM) (such images are hereinafter referred to as AFM images).

In this embodiment, conditions for laser light irradiation are as follows.
Condition A': 547 mJ/cm$^2$
Condition A: 568 mJ/cm$^2$
Condition B: 584 mJ/cm$^2$
Condition C': 608 mJ/cm$^2$ Note that, in this embodiment, a structure and a manufacturing method of a single crystal semiconductor layer are the same as those shown in Embodiment 1 except for conditions for laser light irradiation, and descriptions for the structure and the manufacturing method are omitted. In addition, in this embodiment, concentration distribution in a depth direction of a single crystal semiconductor layer after recrystallization, under the conditions A and B are the same as the results shown in FIGS. 2A and 2B. Although the concentration distribution under the conditions A' and C' is not shown, it can be thought that a solid-liquid interface is positioned nearer to the surface under the condition A' than under the condition A, and the single crystal semiconductor layer is in a narrowly-defined partially melted state. Further, the condition C' can be approximate to the condition C in FIGS. 2A and 2B, and it can be thought that the single crystal semiconductor layer is in a completely melted state.

In this embodiment, conditions for measurement are as follows.
Atomic force microscope (AFM): a scanning probe microscope SPI3800N/SPA500 manufactured by Seiko Instruments Inc.
Measurements mode: dynamic force mode (DFM)
Cantilever: SI-DF40 (made of silicon, with a spring constant of 42 N/m, a resonant frequency of 250 kHz to 390 kHz, and a probe tip of R≦10 nm)
Measurement area: 50 µm×50 µm Note that DFM refers to a measurement mode in which the surface shape of a sample is measured in a state where a cantilever is resonated at a given frequency (a frequency specific to the cantilever) while the distance between a probe and the sample is controlled so that the vibration amplitude of the cantilever is maintained constant. In DFM, the surface of the sample and the cantilever are not in contact with each other; thus, measurement is possible without changing the original shape of the surface of the sample and without damaging the surface.

Figure 12A:
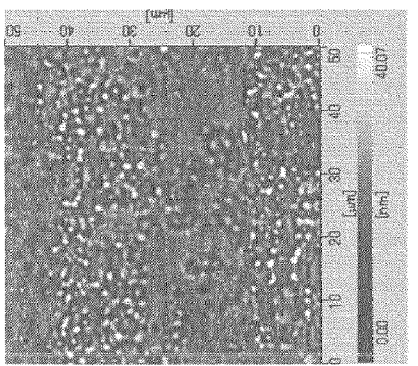
FIGS. 12A to 12E are diagrams showing a result of measurement of a surface of a single crystal semiconductor layer after recrystallization, which is measured by a DFM method.
Figure 12B:
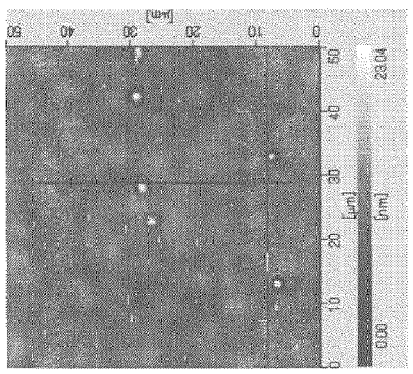
Figure 12C:
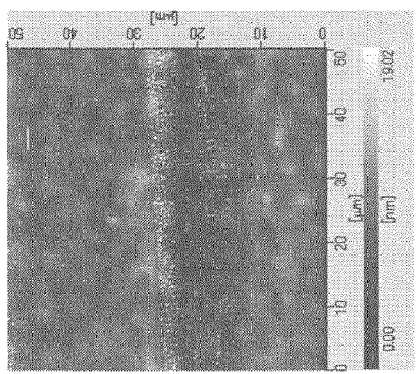
Figure 12D:
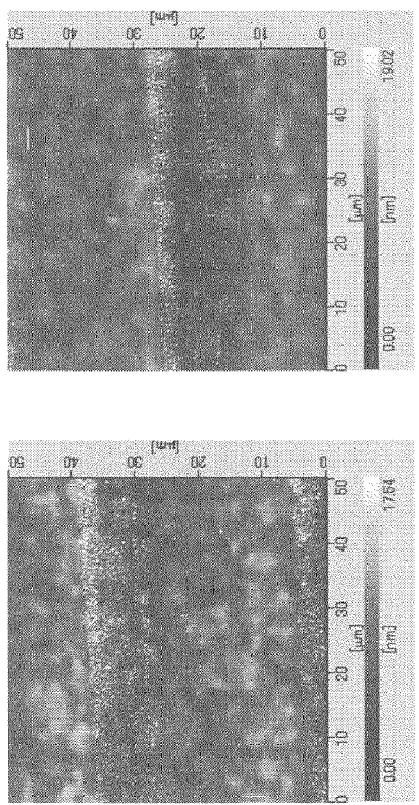
Figure 12E:
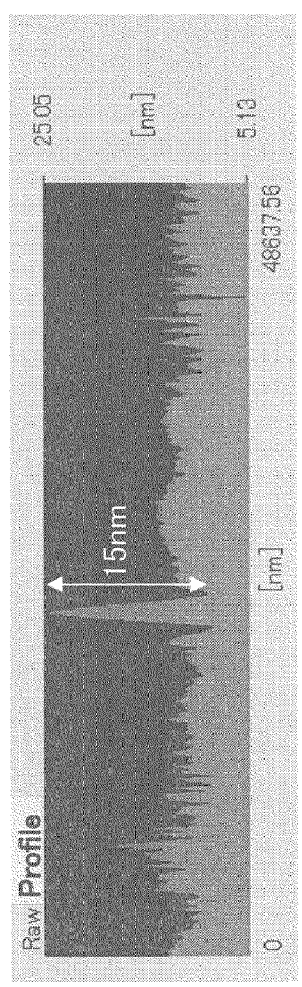

FIGS. 12A to 12D are AFM images of surface of a single crystal semiconductor layer which is irradiated with laser light under the condition A', the condition A, the condition B, and the condition C', respectively. In FIG. 12E, a profile of the surface shape of the single crystal semiconductor layer in a straight line direction shown in FIG. 12C is shown. The surface roughness was analyzed using accessory software, so that average surface roughness Ra and root-mean-square roughness RMS were calculated. In FIG. 12A, the average surface roughness (Ra) was 1.85 nm, and the root-mean-square roughness (RMS) was 2.4 nm. In FIG. 12B, the average surface roughness (Ra) was 1.56 nm, and the root-mean-square roughness (RMS) was 2.5 nm. In FIG. 12C, the average surface roughness (Ra) was 1.36 nm, and the root-mean-square roughness (RMS) was 2.6 nm. In FIG. 12D, the average surface roughness (Ra) was 4.33 nm, and the root-mean-square roughness (RMS) was 5.9 nm.

From data of FIGS. 12A to 12C, it can be seen that the surface of the single crystal semiconductor layer which is in a partially melted state by laser light irradiation and recrystallized is planarized. From data of FIG. 12D, the planarity of the surface of the single crystal semiconductor layer which is completely melted and recrystallized is lost. From data of FIG. 12E, the surface of the single crystal semiconductor layer which has been irradiated with laser light under the condition B and recrystallized is dotted with projections having a diameter of about 1 to 2 µm and a height of about 15 nm.

From the above-described results, it is shown that, in the element concentration distribution in a depth direction of a single crystal semiconductor layer after recrystallization, in the case where irradiation with laser light is performed under a condition where a local maximum of a carbon concentration is observed and a shoulder peak of a hydrogen concentration is observed, a single crystal semiconductor layer has favorable planarity.

Hereinafter, average surface roughness Ra and room-mean-square roughness RMS, which are used in this specification as indexes of surface planarity, are described.

The average surface roughness (Ra) is obtained by expanding into three dimensions center line average roughness Ra that is defined by JIS B 0601:2001 (ISO 4287:1997) so as to be able to apply Ra to a measurement surface. The Ra can be expressed as an average value of the absolute values of deviations from a reference surface to a specific surface and can be given by Formula (a1).

$$R_a = \frac{1}{S_0} \int_{Y_1}^{Y_2} \int_{X_1}^{X_2} |F(X, Y) - Z_0| dX dY \tag{a1}$$

Note that the measurement surface is a surface which is shown by the all measurement data, and is represented by Formula (a2). In Formula (a2), (X, Y) is in the range of (0,0) to $(X_{max}, Y_{max})$.

$$Z = F(X, Y) \tag{a2}$$

The specific surface is a surface which is an object of roughness measurement, and is a rectangular region which is defined by four points represented by the coordinates $(X_1, Y_1)$, $(X_1, Y_2)$, $(X_2, Y_1)$, and $(X_2, Y_2)$. The area of the specific surface when the specific surface is flat ideally is denoted by $S_0$. Then, $S_0$ is obtained from Formula (a3).

$$S_0 = (X_2 - X_1) \cdot (Y_2 - Y_1) \tag{a3}$$

The reference surface is a plane surface represented by $Z = Z_0$ where $Z_0$ is the average value of height of the specific surface. The reference surface is parallel to the XY plane. Note that the average value $Z_0$ is obtained from Formula (a4).

$$Z_0 = \frac{1}{S_0} \int_{Y_1}^{Y_2} \int_{X_1}^{X_2} F(X, Y) dX dY \tag{a4}$$

The root-mean-square surface roughness (RMS) is obtained by expanding into three dimensions the RMS of a cross section curve so as to be able to apply the RMS of a cross section curve to the measurement surface, in a similar manner to Ra. The root-mean-square roughness (RMS) can be represented as the square root of the mean value of the square of the deviation from the reference surface to the specific surface, and is obtained from the following Formula (a5).

$$R_{ms} = \sqrt{\frac{1}{S_0} \int_{Y_1}^{Y_2} \int_{X_1}^{X_2} \{F(X, Y) - Z_0\}^2 dX dY} \tag{a5}$$

This application is based on Japanese Patent Application Serial No. 2008-067302 filed with Japan Patent Office on Mar. 17, 2008, the entire contents of which are hereby incorporated by reference.

What is claimed is:

1. A method for manufacturing a semiconductor substrate comprising the steps of:
irradiating a surface of each of first and second to n-th (n≧3) single crystal semiconductor substrates with ions to form an embrittlement layer at a predetermined depth from the surface of each of the first and second to n-th single crystal semiconductor substrates;
bonding each of the first and second to n-th single crystal semiconductor substrates to a base substrate, with an insulating layer provided over at least one of each of the first and second to n-th single crystal semiconductor substrates and the base substrate, interposed between each of the first and second to n-th single crystal semiconductor substrates and the base substrate;

separating each of the first and second to n-th single crystal semiconductor substrates along the embrittlement layer by heat treatment to fix each of first and second to n-th single crystal semiconductor layers over the base substrate;

irradiating a plurality of regions of the first single crystal semiconductor layer with a plurality of laser lights having energy densities different from one another, each of the energy densities being specific to one of the plurality of regions;

measuring carbon concentration distribution and hydrogen concentration distribution in a depth direction of each of the plurality of regions of the first single crystal semiconductor layer after irradiating with the plurality of laser lights; and irradiating the second to n-th single crystal semiconductor layers with laser light under a condition of energy density where a local maximum of a carbon concentration is observed and a shoulder peak of a hydrogen concentration is observed in concentration distribution in a depth direction of the first single crystal semiconductor layer.

2. The method for manufacturing a semiconductor substrate according to claim 1, wherein the second to the n-th single crystal semiconductor layers are irradiated with the laser light at energy density to be in a partially melted state.

3. The method for manufacturing a semiconductor substrate according to claim 1, wherein the laser light is pulsed laser light.

4. A method for manufacturing a semiconductor substrate comprising the steps of:
irradiating a surface of each of first and second single crystal semiconductor substrates with ions to form an embrittlement layer at a predetermined depth from the surface of each of the first and second single crystal semiconductor substrates;

bonding each of the first and second single crystal semiconductor substrates to a base substrate, with an insulating layer provided over at least one of each of the first and second single crystal semiconductor substrates and the base substrate, interposed between each of the first and second single crystal semiconductor substrates and the base substrate;

separating each of the first and second single crystal semiconductor substrates along the embrittlement layer by heat treatment to fix each of first and second single crystal semiconductor layers over the base substrate;

irradiating a plurality of regions of the first single crystal semiconductor layer with a plurality of laser lights having energy densities different from one another, each of the energy densities being specific to one of the plurality of regions;

measuring hydrogen concentration distribution in a depth direction of each of the plurality of regions of the first single crystal semiconductor layer after irradiating with the plurality of laser lights; and irradiating the second single crystal semiconductor layer with laser light under a condition of energy density where a shoulder peak of a hydrogen concentration is observed in concentration distribution in a depth direction of the first single crystal semiconductor layer.

5. A method for manufacturing a semiconductor substrate comprising the steps of:
forming first and second single crystal semiconductor layers over a base substrate;

irradiating a plurality of regions of the first single crystal semiconductor layer with a plurality of laser lights having energy densities different from one another, each of the energy densities being specific to one of the plurality of regions;

measuring hydrogen concentration distribution in a depth direction of each of the plurality of regions of the first single crystal semiconductor layer after irradiating with the plurality of laser lights; and irradiating the second single crystal semiconductor layer with laser light under a condition of energy density where a shoulder peak of a hydrogen concentration is observed in concentration distribution in a depth direction of the first single crystal semiconductor layer.

6. The method for manufacturing a semiconductor substrate according to claim 4, wherein the second single crystal semiconductor layer is irradiated with the laser light at energy density to be in a partially melted state.

7. The method for manufacturing a semiconductor substrate according to claim 5, wherein the second single crystal semiconductor layer is irradiated with the laser light at energy density to be in a partially melted state.

8. The method for manufacturing a semiconductor substrate according to claim 4, wherein the laser light is pulsed laser light.

9. The method for manufacturing a semiconductor substrate according to claim 5, wherein the laser light is pulsed laser light.

* * * * *